United States Patent
Hernes

(10) Patent No.: US 8,344,920 B1
(45) Date of Patent: Jan. 1, 2013

(54) METHODS AND APPARATUS FOR CALIBRATING PIPELINE ANALOG-TO-DIGITAL CONVERTERS

(75) Inventor: Bjornar Hernes, Trondheim (NO)

(73) Assignee: Hittite Microwave Norway AS, Tiller (NO)

(*) Notice: Subject to any disclaimer, the term of this patent is extended or adjusted under 35 U.S.C. 154(b) by 0 days.

(21) Appl. No.: 13/248,754

(22) Filed: Sep. 29, 2011

(51) Int. Cl.
    *H03M 1/10* (2006.01)
(52) U.S. Cl. ........ 341/120; 375/376; 375/354; 375/345; 375/316; 330/104
(58) Field of Classification Search .......... 341/120–155; 375/316–376; 330/104
    See application file for complete search history.

(56) References Cited

U.S. PATENT DOCUMENTS

| | | | |
|---|---|---|---|
| 5,465,092 A | 11/1995 | Mayes et al. | |
| 6,184,809 B1 | 2/2001 | Yu | |
| 6,198,423 B1 | 3/2001 | Yu | |
| 6,366,230 B1 | 4/2002 | Zhang et al. | |
| 6,486,807 B2 | 11/2002 | Jonsson | |
| 6,489,904 B1 | 12/2002 | Hisano | |
| 6,563,445 B1 | 5/2003 | Sabouri | |
| 6,567,025 B2 | 5/2003 | Schreier et al. | |
| 6,603,416 B2 * | 8/2003 | Masenas et al. | 341/120 |
| 6,700,403 B1 | 3/2004 | Dillon | |
| 6,810,266 B1 * | 10/2004 | Ecklund et al. | 375/316 |
| 6,975,950 B2 | 12/2005 | Bardsley | |
| 7,015,842 B1 | 3/2006 | Gupta et al. | |
| 7,107,175 B2 | 9/2006 | Maloberti et al. | |
| 7,126,508 B2 | 10/2006 | Seki | |
| 7,221,299 B2 | 5/2007 | Bjornsen | |
| 7,312,734 B2 | 12/2007 | McNeill et al. | |
| 7,460,045 B1 * | 12/2008 | Cartina | 341/120 |
| 7,495,596 B2 | 2/2009 | Kim et al. | |
| 7,551,114 B2 | 6/2009 | Joy et al. | |
| 7,573,417 B2 | 8/2009 | Bailey et al. | |
| 7,649,957 B2 * | 1/2010 | Garrity et al. | 375/280 |
| 7,741,987 B2 | 6/2010 | Yung et al. | |
| 2009/0201051 A1 | 8/2009 | Ono et al. | |

FOREIGN PATENT DOCUMENTS

WO 2011/051763 A1 5/2011

OTHER PUBLICATIONS

Hernes et al., "A 92.5mW 205MS/s 10b Pipeline IF ADC Implemented in 1.2V13.3V 0.13mm CMOS," 2007 IEEE International Solid-State Ciruits Conference, Digest of Technical Papers, Feb. 14, 2007, pp. 462-463 and 615.

Sumanen et al., "A 10-bit 200-MS/s CMOS Parallel Pipeline A/D Converter," IEEE Journal of Solid-State Circuits, vol. 36, No. 7, Jul. 2001, pp. 1048-1055.

* cited by examiner

*Primary Examiner* — Lam T Mai
(74) *Attorney, Agent, or Firm* — Rajesh Vallabh; Foley Hoag LLP

(57) ABSTRACT

Methods and apparatus are provided for calibrating a pipeline analog-to-digital converter including one or more serially connected analog-to-digital pipeline stages and a back-end analog-to-digital converter.

58 Claims, 14 Drawing Sheets

METHODS AND APPARATUS FOR CALIBRATING PIPELINE ANALOG-TO-DIGITAL CONVERTERS

BACKGROUND

This patent generally relates to analog-to-digital conversion and, more particularly, to a calibration scheme used for one or more of the stages in pipeline Analog-to-Digital converters (ADCs).

Pipeline ADCs are a preferred architecture for medium to high speed, high resolution ADCs. Pipeline ADCs have lower power consumption and lower comparator accuracy than flash ADCs and higher throughput due to the pipelining of lower accuracy stages compared to cyclic ADCs. Pipeline ADCs are switched capacitor circuits relying on capacitor matching and high op-amp open loop gain to achieve high accuracy. In applications where distortion has to be very low, the need for accuracy is high, and calibration of capacitor mismatches and finite op-amp open loop gain is essential.

SUMMARY

In accordance with one or more embodiments, a method is provided for calibrating a pipeline analog-to-digital converter comprising one or more serially connected analog-to-digital pipeline stages and a back-end analog-to-digital converter. The pipeline analog-to-digital converter further includes digital circuitry for receiving digital outputs of each of the one or more pipeline stages and the back-end converter, adjusting the outputs using calibration coefficients to correct additive, multiplicative, and offset errors, and combining the outputs. The method includes the steps of: (a) for a selected pipeline stage: (i) disconnecting inputs of the pipeline stage from an immediately preceding pipeline stage, or if the pipeline stage is the first pipeline stage of the pipeline analog-to-digital converter disconnecting inputs of the pipeline stage from an input of the pipeline analog-to-digital converter; (ii) measuring values for stage gain errors, stage capacitive mismatch errors, and stage offset errors for the pipeline stage; (iii) calculating calibration coefficients for the pipeline stage based on the measured values and updating the calibration coefficients for use in correcting additive, multiplicative, and offset errors in a normal operation mode of the pipeline stage; and (iv) connecting the inputs of the pipeline stage to the immediately preceding pipeline stage, or if the pipeline stage is the first pipeline stage connecting inputs of the pipeline stage to an input of the pipeline analog-to-digital converter, such that the pipeline stage can operate in a normal operation mode; and (b) if the selected pipeline stage is not the first pipeline stage, repeating steps (i)-(iv) separately for each pipeline stage immediately preceding the pipeline stage last calibrated until all pipeline stages preceding said selected pipeline stage have been successively calibrated so that the pipeline analog-to-digital converter can be used in a normal operation mode.

A pipeline analog-to-digital converter in accordance with one or more embodiments includes one or more serially connected analog-to-digital pipeline stages. A back-end analog-to-digital converter is serially connected to the last one of the one or more pipeline stages. Digital circuitry is provided for receiving digital outputs of each of the one or more pipeline stages and the back-end converter, adjusting the outputs using calibration coefficients to correct additive, multiplicative, and offset errors, and combining the outputs. A plurality of memory elements store the calibration coefficients for each of the pipeline stages. A calibration measurement unit is provided for calibrating the pipeline analog-to-digital converter by measuring values for stage gain errors, stage capacitive mismatch errors, and stage offset errors for a selected pipeline stage disconnected from an immediately preceding pipeline stage or from an input of the pipeline analog-to-digital converter, calculating the calibration coefficients for the pipeline stage based on the measured values and updating the calibration coefficients in the memory elements for use in correcting additive, multiplicative, and offset errors in a normal operation mode of the pipeline stage, and if the selected pipeline stage is not the first pipeline stage, repeating the calibration steps separately for each pipeline stage immediately preceding the pipeline stage last calibrated until all pipeline stages preceding the selected pipeline stage have been successively calibrated so that the pipeline analog-to-digital converter can be used in a normal operation mode.

In accordance with one or more further embodiments, a method is provided of calibrating a pipeline analog-to-digital converter comprising one or more serially connected analog-to-digital pipeline stages and a back-end analog-to-digital converter. The pipeline analog-to-digital converter further includes digital circuitry for receiving digital outputs of each of the one or more pipeline stages and the back-end converter, adjusting the outputs using calibration coefficients to correct additive, multiplicative, and offset errors, and combining the outputs. The method comprises the steps of: (a) disconnecting an input of a selected pipeline stage of the one or more serially connected analog-to-digital pipeline stages from an immediately preceding pipeline stage or from an input of the pipeline analog-to-digital converter; (b) measuring values for stage gain errors, stage capacitive mismatch errors, and stage offset errors for the selected pipeline stage; (c) calculating calibration coefficients for the selected pipeline stage based on the measured values and updating the calibration coefficients for use in correcting additive, multiplicative, and offset errors in a normal operation mode of the pipeline stage; and (d) connecting the input of the selected pipeline stage to the immediately preceding pipeline stage or to the input of the pipeline analog-to-digital converter such that the pipeline stage can operate in a normal operation mode.

In accordance with one or more further embodiments, a pipeline analog-to-digital converter is provided including one or more serially connected analog-to-digital pipeline stages and a back-end analog-to-digital converter serially connected to the last one of the one or more pipeline stages. Digital circuitry is provided for receiving digital outputs of each of the one or more pipeline stages and the back-end converter, adjusting the outputs using calibration coefficients to correct additive, multiplicative, and offset errors, and combining the outputs. A plurality of memory elements store the calibration coefficients for each of the pipeline stages. A calibration measurement unit is provided for calibrating the pipeline analog-to-digital converter by measuring values for stage gain errors, stage capacitive mismatch errors, and stage offset errors for a selected pipeline stage disconnected from an immediately preceding pipeline stage or from an input of the pipeline analog-to-digital converter, and calculating the calibration coefficients for the pipeline stage based on the measured values and updating the calibration coefficients in the memory elements for use in correcting additive, multiplicative, and offset errors in a normal operation mode of the pipeline stage.

DETAILED DESCRIPTION OF EMBODIMENTS

Figure 1:
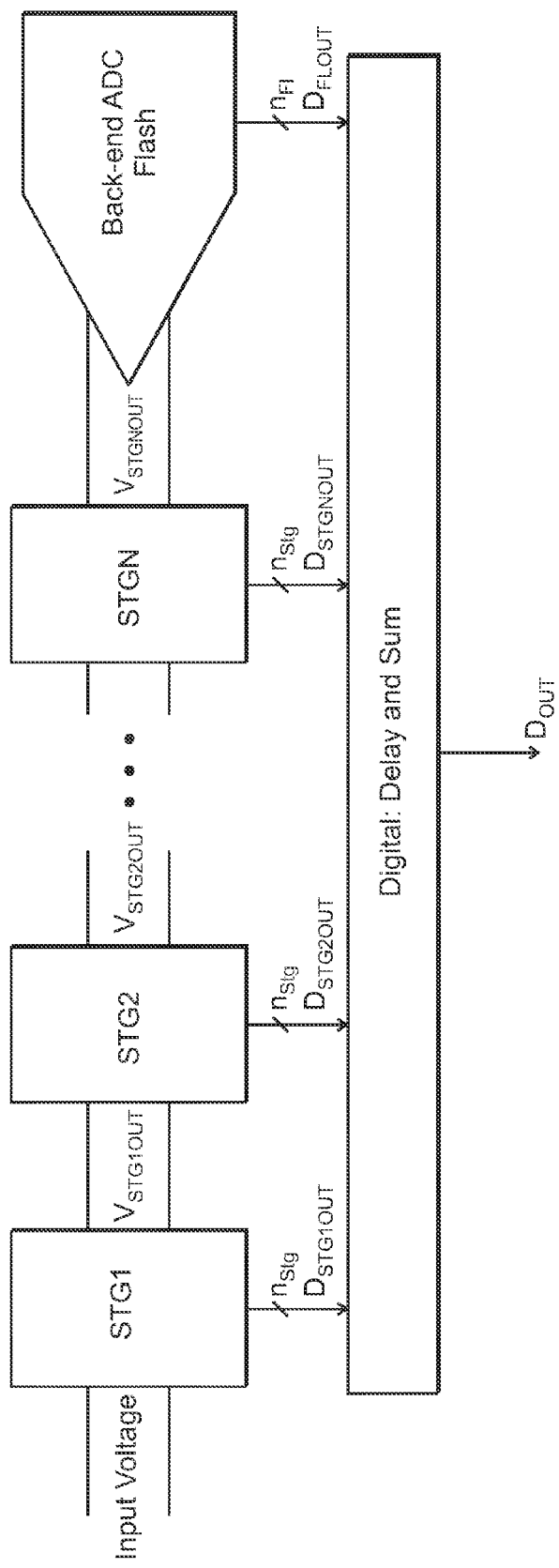
FIG. 1 is a block diagram illustrating an exemplary pipeline ADC structure.

FIG. 1 is a block diagram of an exemplary pipeline ADC. An analog input voltage is applied to the first stage STG1 in the pipeline ADC. STG1 resolves the $n_{Stg}$ bits of the input signal, and this digital value is delivered to a digital delay and sum block. The rest of the analog input signal is gained and appears at the stage analog output delivered to the following stage STG2. This operation is synchronized such that the input sample of the analog input voltage propagates through the pipeline chain, so when the previous sample is processed by STG2, a new sample is processed by STG1. An ordinary flash structured ADC is typically utilized at the end of the pipeline chain. In general, the resolution of each stage can be different, but due to the repeating structure, it is common to reuse stages, especially in the back of the chain.

Figure 2:
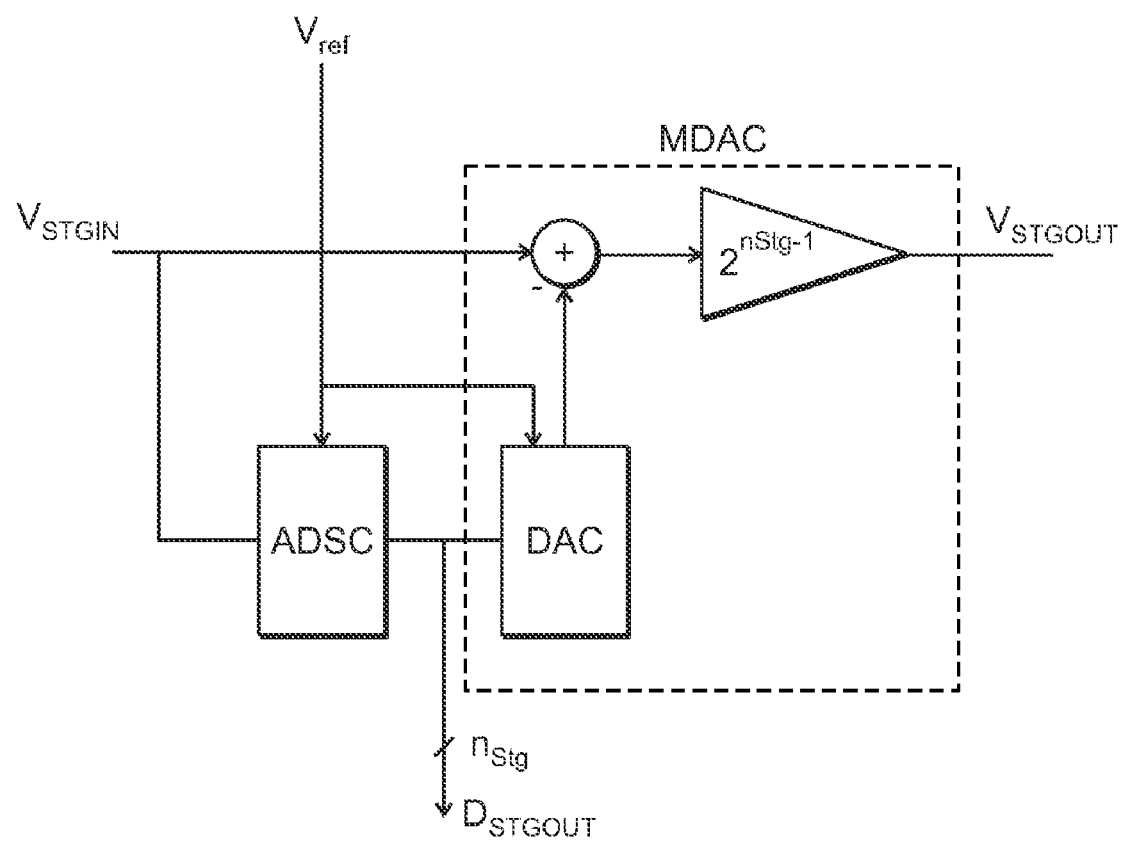
FIG. 2 is a block diagram illustrating the general functionality of a pipeline stage.

FIG. 2 shows the general functionality of a pipeline stage. The stage input voltage $V_{STGIN}$ is sampled in a multiplying digital-to-analog-converter (MDAC) and in an analog-to-digital-sub-converter (ADSC) at the same time instance. The ADSC compares the sampled input signal to a reference voltage $V_{REF}$ and outputs a digital value $D_{STGOUT}$ as a result of the comparison. $D_{STGOUT}$ is then applied to the MDAC and the delay and sum circuit shown in FIG. 1. The MDAC converts $D_{STGOUT}$ back to the analog domain, and subtracts it from $V_{STGIN}$, resulting in the stage quantization error. The quantization error is then gained by the factor $2^{nStg-1}$, where $n_{Stg}$ is the number of output bits of the stage. The resulting stage output voltage is called the stage residue.

Because of the gain larger than 1 of each stage, it is the stage sampling the ADC input voltage that has the highest specification with respect to noise and accuracy. The stages down the pipeline chain will have relaxed specifications. Therefore, it will be the first stages of the pipeline ADC that will have demands for calibration to fulfill the overall distortion specification of the ADC.

Figure 4A:
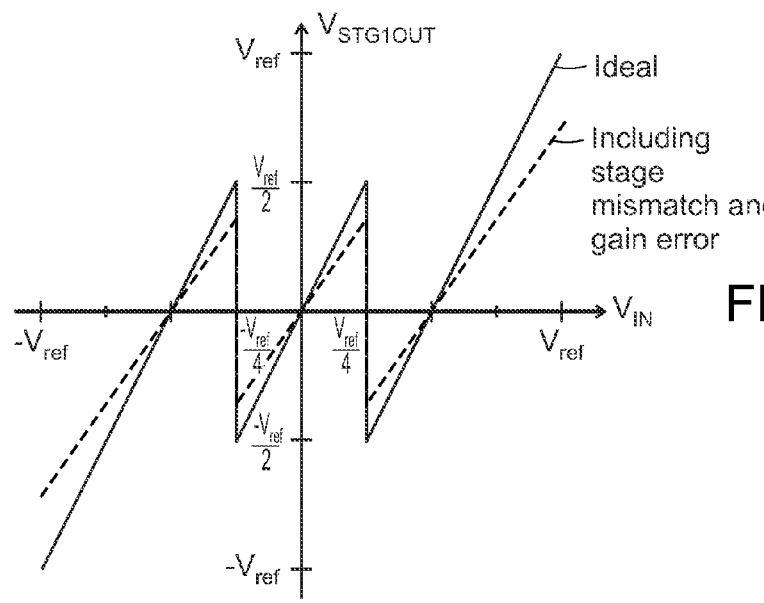
FIG. 4A is a graph strafing the 1.5 b stage transfer function including stage mismatch and gain errors.
Figure 4B:
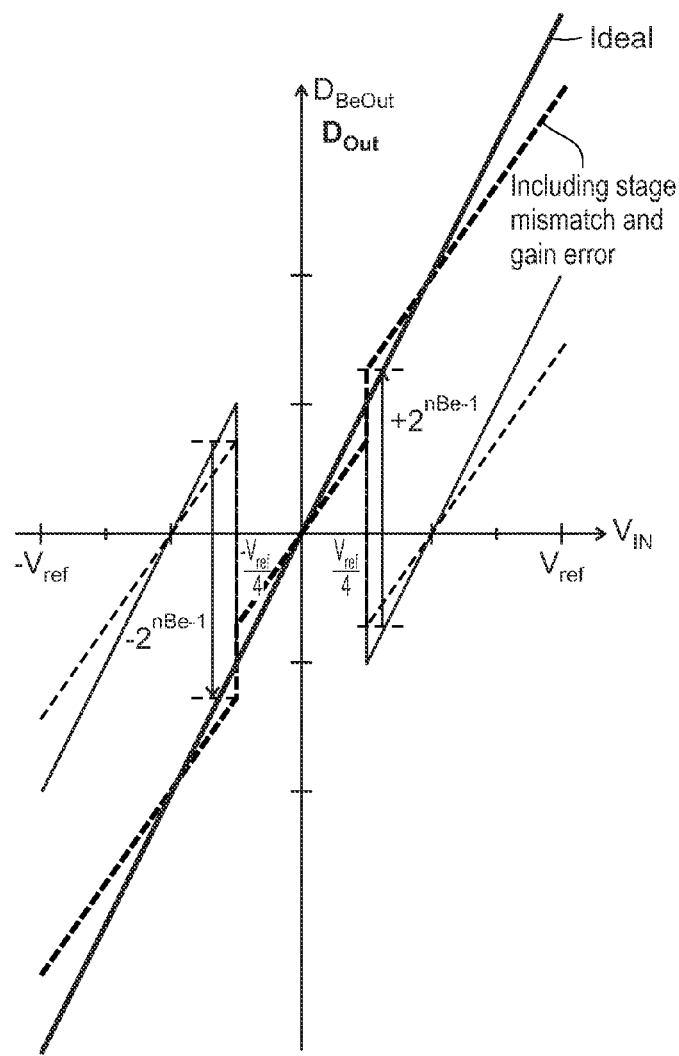
FIG. 4B is a graph illustrating digital signals versus stage input voltage, including stage mismatch and gain errors.
Figure 5:
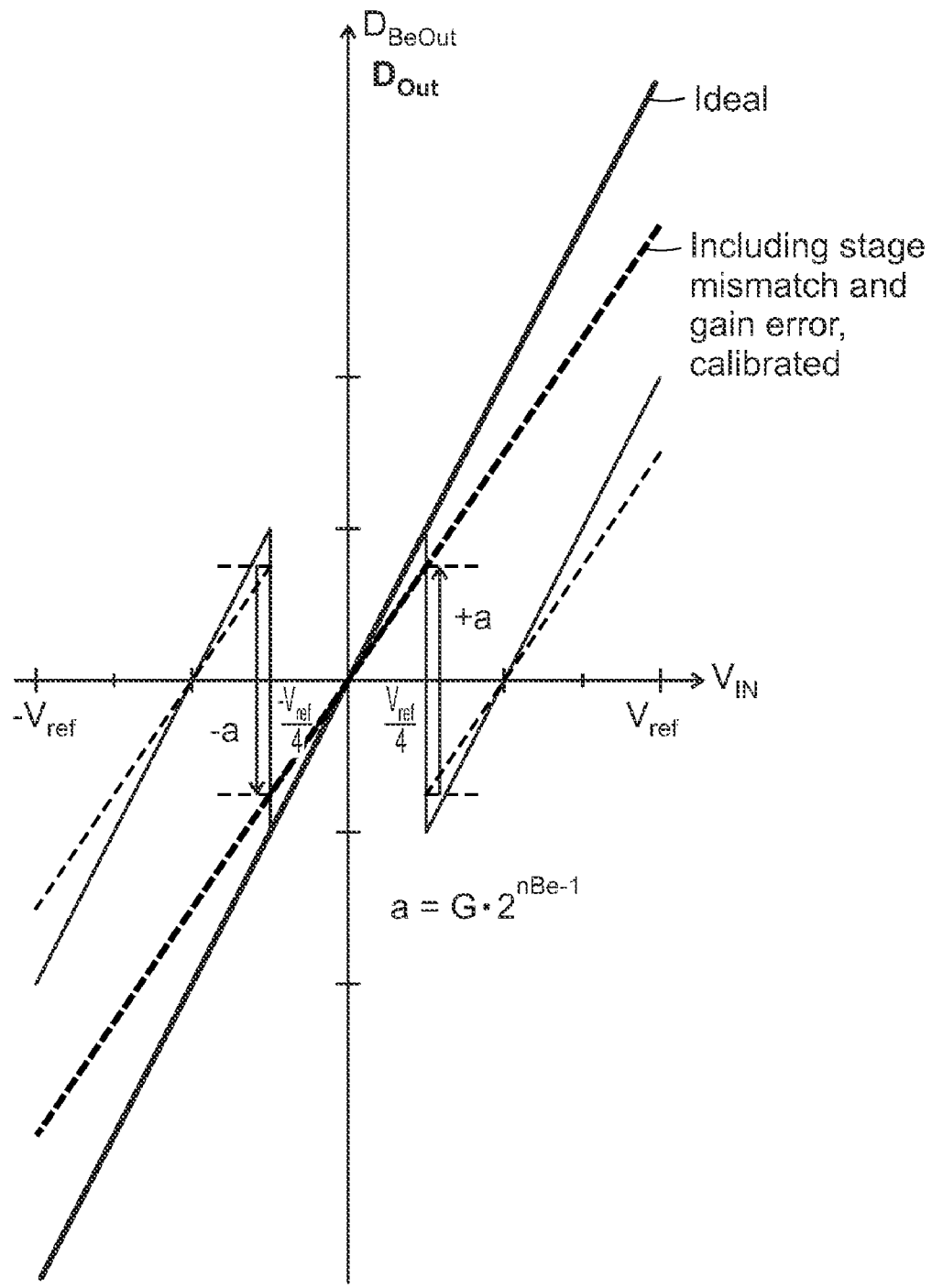
FIG. 5 is a graph illustrating digital signals versus stage input voltage after calibration in accordance with the prior art.
Figure 6:
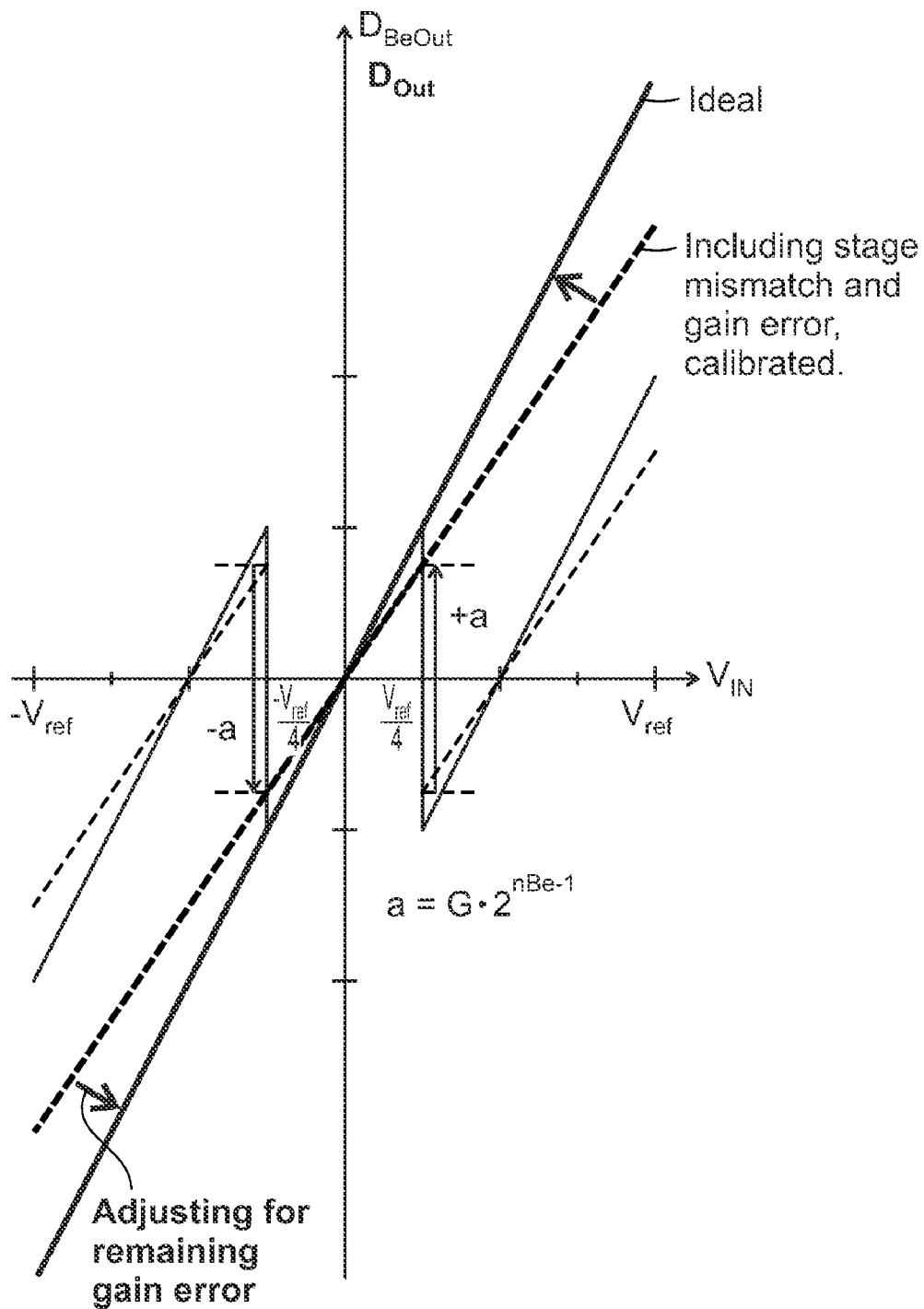
FIG. 6 is a graph illustrating digital signals versus stage input voltage after calibration of stage and ADC gain in accordance with various embodiments.

FIGS. 3-6 illustrate exemplary error effects of a general pipeline stage. FIGS. 3-5 show error effects in the prior art, while FIG. 6 shows error correction in accordance with various embodiments. For the sake of simplicity, the figures illustrate a 1.5 b stage. However, the same analysis applies for generally any stage resolution.

Figure 3A:
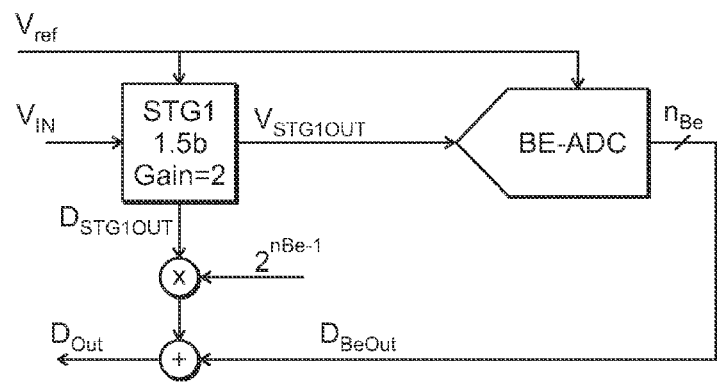
FIG. 3A is a block diagram illustrating the first 1.5 b pipeline stage of a pipeline ADC.
Figure 3B:
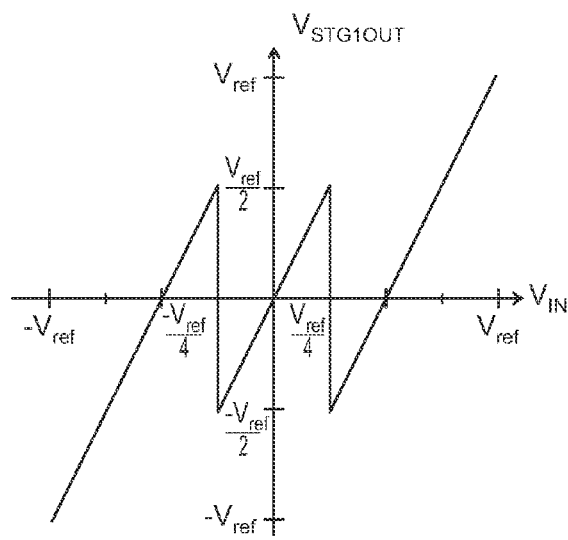
FIG. 3B is a graph illustrating the 1.5 b stage transfer function of the FIG. 3A stage.
Figure 3C:
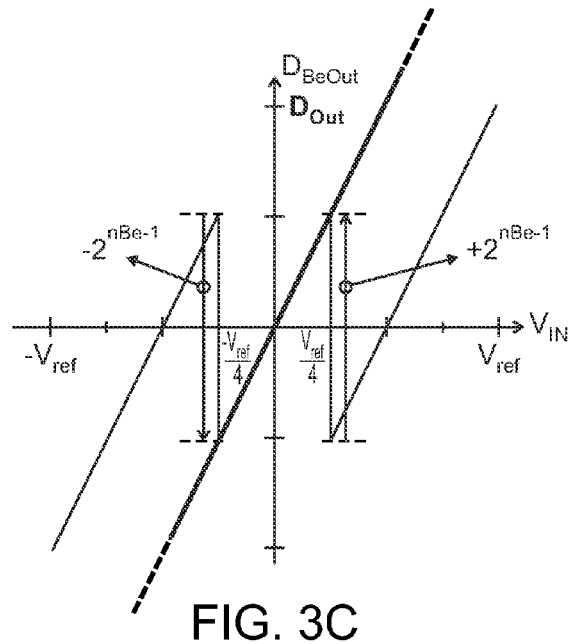
FIG. 3C is a graph illustrating digital signals versus stage input voltage of the FIG. 3A stage.

FIG. 3A shows the first stage of a pipeline ADC followed by a back-end (BE) ADC containing the rest of the pipeline stages. The ADC input voltage $V_{IN}$ is applied to the input of the stage, which is the ADC input since this is the first stage in the pipeline ADC. The stage residue voltage $V_{STG1OUT}$ is passed to the BE-ADC, which has $n_{Be}$ bits of resolution, giving out the digital signal values $D_{BeOut}$. $D_{BeOut}$ is further summed with $D_{STG1OUT}$, which is multiplied with $2^{nBe-1}$, resulting in $D_{Out}$. FIG. 3B shows the stage residue $V_{STG1OUT}$ versus $V_{IN}$. Since this is a 1.5 b stage the stage gain equals 2. When $V_{IN} > V_{REF}/4$, $V_{REF}$ is subtracted from the stage output voltage, and for $V_{IN} < V_{REF}/4$, $V_{REF}$ is added to the output. FIG. 3C shows $D_{BeOut}$ and $D_{Out}$ (shown in bold) versus $V_{IN}$. The summation of $D_{STG1OUT}$ and $D_{BeOut}$ do the Opposite operation of the stage; for $V_{IN} > V_{REF}/4$, the digital value of $V_{REF}$ ($2^{nBe-2}$) is added, and for $V_{IN} < -V_{REF}/4$, the digital value of $V_{REF}$ is subtracted, such that $D_{Out}$ versus $V_{IN}$ is a perfect straight line. This is the ideal case, where the stage has an ideal behavior.

However, in actual circuits, the stage will have errors such as mismatch in gain setting elements and finite accuracy due to limited open-loop gain in the stage op-amp. This results in the gain of the stage deviating from the ideal value (in the case of 1.5 b stage, the ideal gain value is 2), and addition/subtraction of $V_{REF}$ will not be exactly $V_{REF}$. This is illustrated in FIGS. 4A and 4B, where FIG. 4A shows the stage residue and FIG. 4B shows what happens after summation of $D_{BeOut}$ and $D_{STG1OUT}$. $D_{Out}$ will not be a straight line, resulting in distortion. For moderate distortion performance level, it is possible to make the pipeline stages accurate enough to meet the specifications. However, for low distortion levels, it is necessary to perform calibration of one or more of the stages in the pipeline ADC.

In prior art calibration techniques, the step size of the addition/subtraction of $V_{REF}$ done by the stage is measured and subtracted/added respectively in the digital domain instead of the digital representation of $V_{REF}$. This results in a straight line as shown in FIG. 5. Here, the step $a = G \cdot 2^{nBe-1}$ has been measured and is used when adding the steps in the sum operation of the BE-ADC output and the stage digital output. By this operation, using an ordinary pipeline ADC, the distortion seen by the non-calibrated case of FIG. 4B is canceled out. However, the gain of the stage, and subsequently the gain of the ADC, is not corrected for. In ADC architectures such as time-interleaved ADCs, double sampling ADCs and background calibrated parallel ADC, mismatch in ADC gain between the ADCs will result in distortion. Therefore, it is desirable to also calibrate for the remaining gain error of FIG. 5, as shown in FIG. 6, the result of calibration techniques in accordance with various embodiments.

A 2.8 b stage is used herein to describe calibration techniques in accordance with various embodiments. This is by way of example only, and embodiments of the invention can be implemented on any resolution of the pipeline stage, and also in single sampled and double sampled pipeline stages. Single sampling is the ordinary approach, where the stage analog input voltage is sampled into one single-ended or differential sampling network, including switches and capacitors. Double sampling occurs when the stage analog input signal is sampled by two single-ended or differential input networks time-interleaved such that the stage throughput is doubled compared to the single sampling approach.

In accordance with various embodiments, before calibration of a stage can take place, the whole ADC is placed off-line. This may be at start up of the ADC or when the ADC is not used by the system. It can also be used in a system where the ADC is one of several ADCs connected in parallel to gain higher signal-to-noise ratio (SNR). It is then possible to take one ADC off-line for calibration and still maintain the SNR as indicated, e.g., in PCT Publication WO2011/051763. Stage calibration is performed by first measuring the errors, thereafter updating the stage set of coefficients, which further are used to adjust for the stage errors under normal operation.

In stage calibration procedure in accordance with various embodiments, the following errors are calibrated for:
Stage offset voltage;
Limited open loop gain in stage op-amp (not gain compression); and
Stage capacitor mismatch.

In the measuring phase, the stage itself and the back-end ADC are used to measure the errors. However, the measurement cannot be better than the measurement equipment. To lower the white noise level, each error is found as mean of a number of samples. The number of samples needed depends on the ADC noise level, the required accuracy of the error, and the stage location in the pipeline chain.

Figure 7:
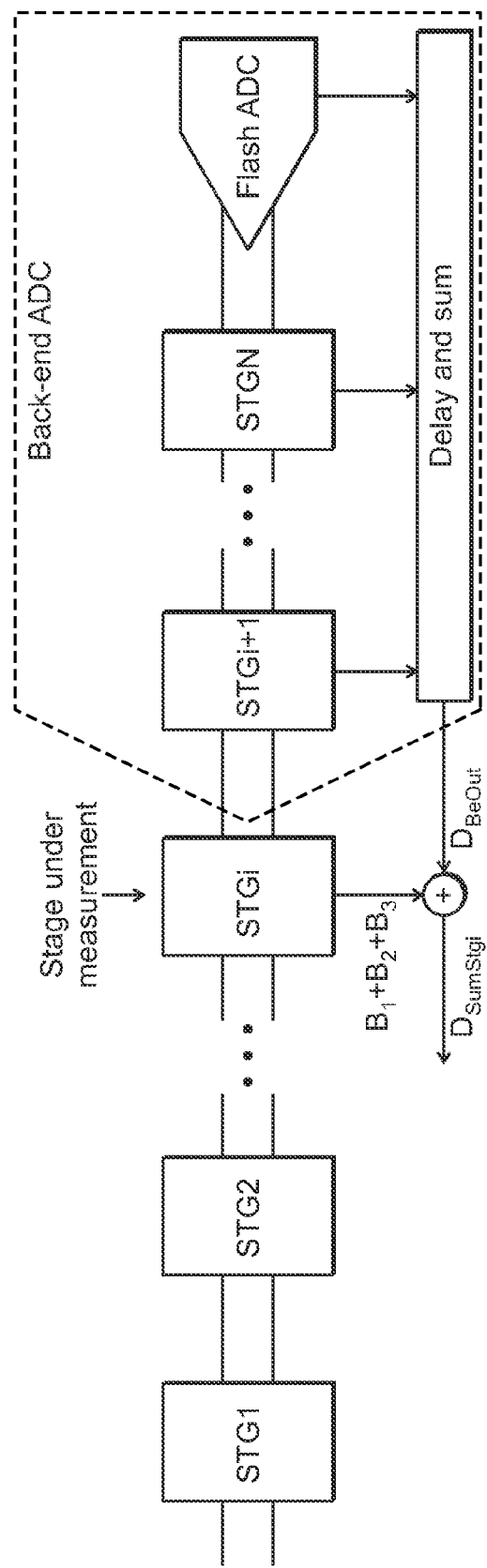
FIG. 7 is a block diagram illustrating an exemplary pipeline ADC structure in which a calibration measurement is performed in accordance with one or more embodiments.

Referring to FIG. 7, an exemplary measurement procedure in accordance with one or more embodiments for a selected stage, STGi, located somewhere in the pipeline chain is as follows. The output of the stage, the stage residue, is further quantized by the back-end ADC.

First, the offset of the stage STGi and the back-end ADC is measured by sampling zero voltage at the stage input. The offset term is also calculated and updated.

Next, the stage gain is measured in all the different segments to find the combined capacitor mismatch and gain error due to finite op-amp open loop gain.

New gain coefficients are calculated, and the registers (or other memory elements) storing the coefficients are updated.

Instead of performing a separate measurement of the offset error, the offset measurement can be done during the other measurements. This will reduce the number of clock cycles spent in measurement and increase the accuracy of the offset measurement.

When measurement of one stage is done, the same procedure is carried out successively for each preceding stage including the first stage (STG1). After the first stage has been calibrated, the calibration is finished, and the ADC is put back on-line again.

This technique can also be used to implement background calibration of an ADC comprising two or more parallel connected ADCs. Background calibration of an ADC comprising two or more parallel connected ADCs is described by way of example in PCT Publication WO2011/051763.

Figure 8:
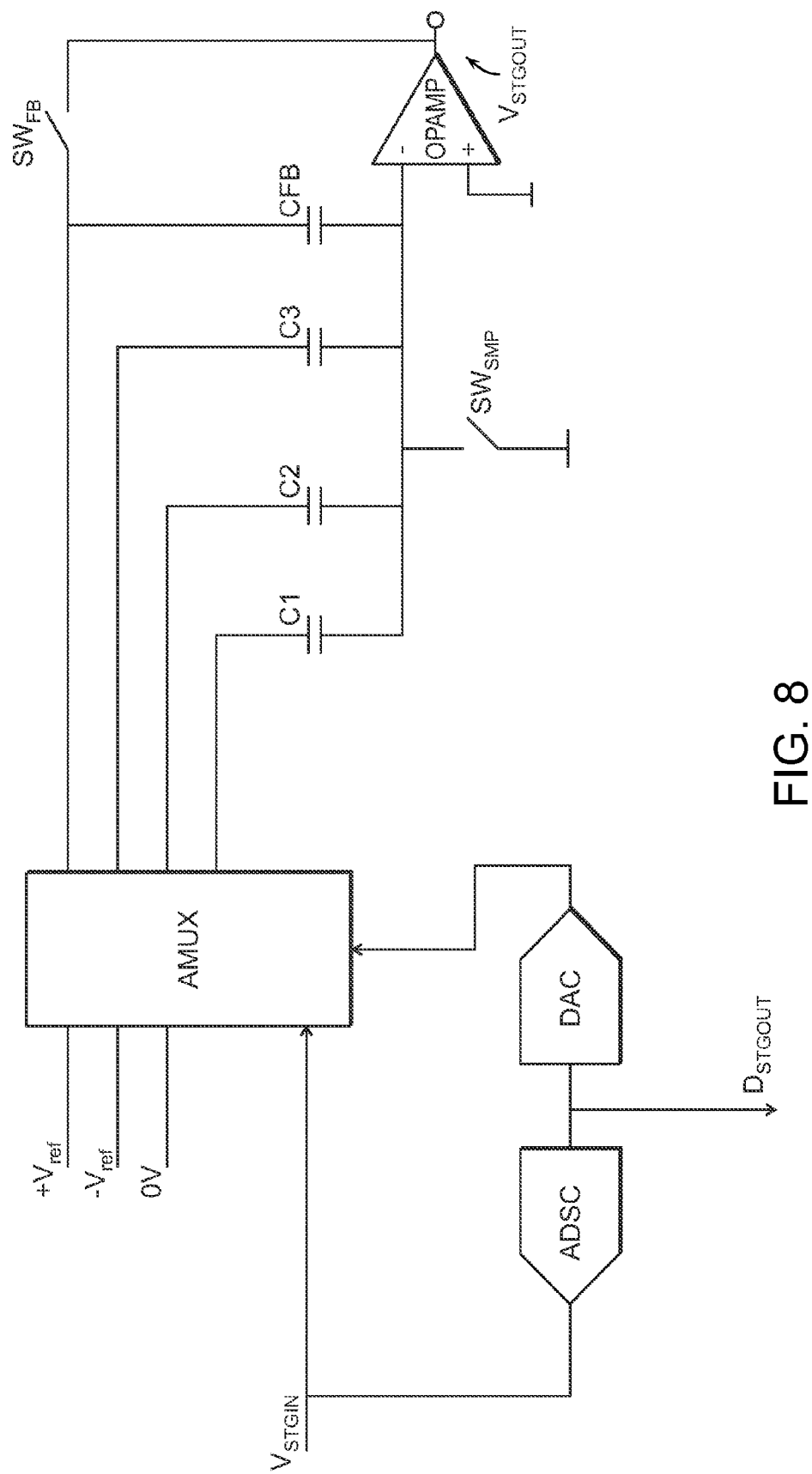
FIG. 8 is a block diagram illustrating a pipeline stage in normal operation in accordance with the prior art.

FIG. 8 shows an example of implementation of a 2.8 bit stage. FIG. 8 shows a single-ended circuit for simplicity. However, the following analysis also apples to differential implementation.

FIG. 8 illustrates the stage in normal operational mode. In the stage sampling phase, the capacitors C1, C2, C3, and CFB are all connected to the input voltage such that the voltage over the capacitors is tracking the input voltage. At the end of the sampling phase, $SW_{SMP}$ is opened and the stage input voltage is stored over the capacitors. At the same time, the stage input voltage is sampled by the ADSC and compared to the reference voltages. The result of the comparison is a digital value $D_{STGOUT}$ delivered to the delay and sum circuit of FIG. 1 and to the stage digital-to-analog converter (DAC). In the next clock phase, the DAC steers the analog multiplexer (AMUX) such that the top of each of C1, C2, and C3 is connected to +Vref, −Vref, or zero depending on $D_{STGOUT}$. Further, in this phase, $SW_{FB}$ is closed, wrapping CFB around the op-amp.

Figure 9:
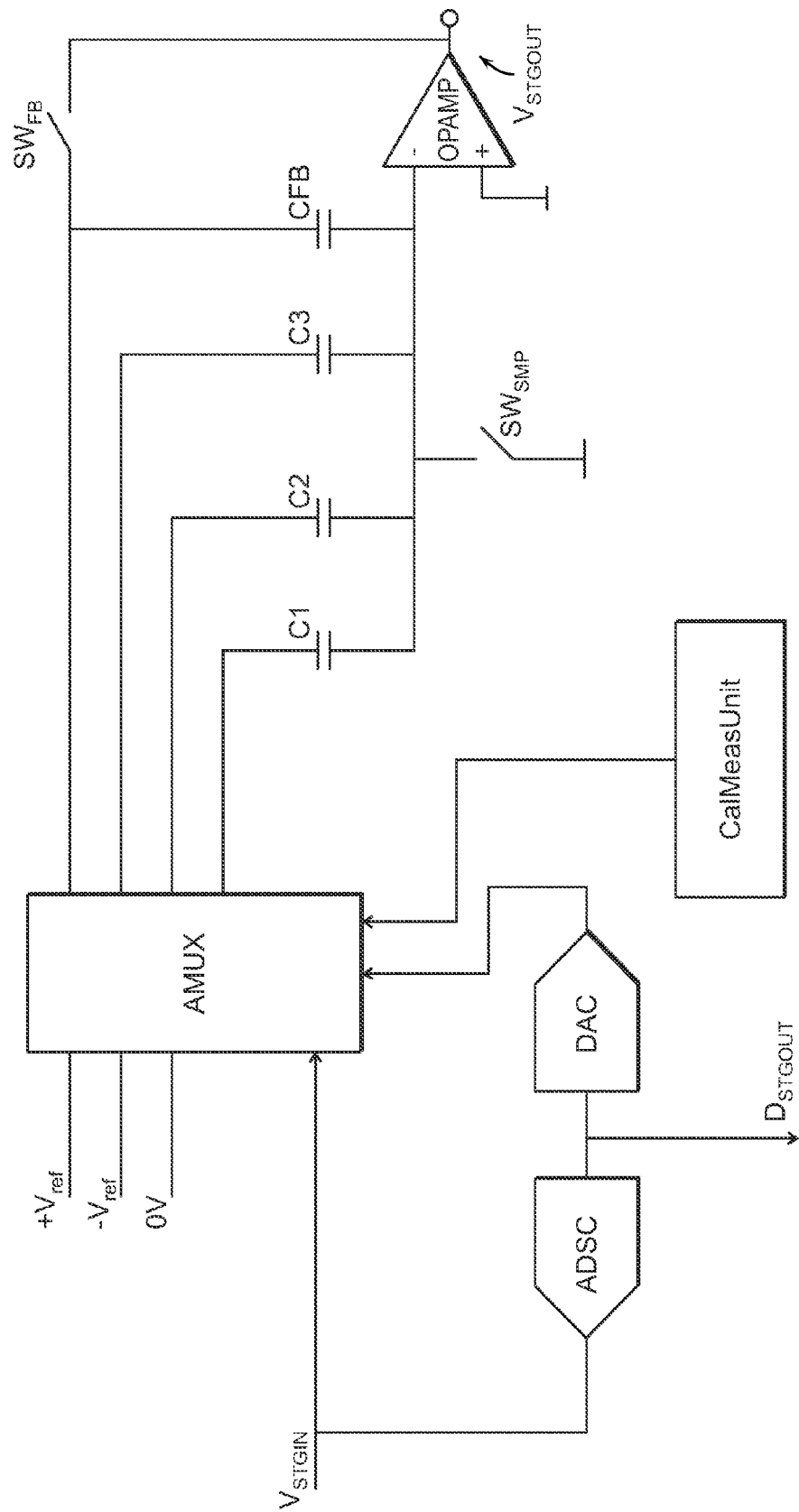
FIG. 9 is a block diagram illustrating a pipeline stage, in which a stage calibration measurement operation is performed.

FIG. 9 illustrates the stage in calibration measurement mode. When capacitor mismatch, finite op-amp gain, and stage offset are measured, the stage operation is somewhat different from normal operation. In the sampling phase, the reference voltages are applied to the top of one of the capacitors C1, C2, C3, and CFB through AMUX controlled by a calibration measurement unit (CalMeasUnit). The rest of the capacitors are connected to zero voltage. In the next phase, ADSC and DAC are inactive, and C1, C2, and C3 are connected to zero voltage, while CFB is connected to the op-amp output. The stage output voltage is now applied to the back-end ADC, which is sampling and quantizing this voltage.

The output of the back-end ADC is given in Eq. (1). Here, $n_{Be}$ is the number of bits in the back-end ADC, $V_{Ref}$ is the ADC reference voltage, $V_{StgIn}$ is the stage input voltage, and $B_1$ to $B_3$ ($\in\{-1,0,1\}$) is the output of the stage sub-ADC. The digital output $B_1$ to $B_3$ is also passed to the digital part ("Delay and Sum" of FIG. 1), and summed to the output of the back-end ADC $D_{BeOut}$ as shown by FIG. 7.

The stage gain and the MDAC output are set by capacitor ratios and the closed-loop gain $G_e$. $G_e$ results from the feedback factor $\beta$ and the limited open-loop gain $A_0$ of the stage op-amp, as shown by Eq. (2). The capacitor mismatch effects are defined in Eq. (3). First, the sampling capacitor $C_s$ is the sum of $C_1$ to $C_3$ and $C_{FB}$. Ideally, each of the capacitors $C_1$ to $C_3$ and $C_{FB}$ should be equal to a unit capacitor $C=C_s/4$ to maintain correct stage gain and output of MDAC. However, all capacitors have mismatch resulting in a deviation $\delta$ from C as Eq. (3) shows. Since the sum of all capacitors always are equal to 4·C, the sum of $\delta$ will be zero as shown by Eq. (4).

$$D_{BeOut} = \left\lfloor \frac{G_E \cdot \left(\frac{4 \cdot C}{C_{FB}}\right) \cdot \left(V_{Stgin} - \frac{(C_1 \cdot B_1 + C_2 \cdot B_2 + C_3 \cdot B_3)}{4 \cdot C} \cdot V_{ref}\right)}{V_{Ref}} \cdot \frac{2^{n_{Be}} - 1}{2} \right\rfloor \quad (1)$$

$$G_E = \frac{A_0 \cdot \beta}{1 + A_0 \cdot \beta} \quad (2)$$

$$\beta = \frac{C_{FB}}{C_1 + C_2 + C_3 + C_{FB}}$$

$$C_S = C_1 + C_2 + C_3 + C_{FB} = 4 \cdot C$$

$$C_1 = C \cdot (1 + \delta_1)$$

$$C_2 = C \cdot (1 + \delta_2)$$

$$C_3 = C \cdot (1 + \delta_3)$$

$$C_{FB} = C \cdot (1 + \delta_{FB}) \quad (3)$$

$$\delta_1 + \delta_2 + \delta_3 + \delta_{FB} = 0 \quad (4)$$

$$D_{BeOut} = \left| \left( \frac{G_E}{1+\delta_{FB}} \cdot 4 \cdot \frac{V_{StgIn}}{V_{Ref}} - \right. \right. \tag{5}$$
$$\left. \left. \frac{G_E}{1+\delta_{FB}} \cdot ((1+\delta_1) \cdot B_1 + (1+\delta_2) \cdot B_2 + (1+\delta_3) \cdot B_3) \right) \cdot \frac{2^{n_{Be}-1}}{2} \right|$$

$$D_{SumStgi} = \tag{6}$$
$$\left| \left( \frac{G_E}{1+\delta_{FB}} \cdot 4 \cdot \frac{V_{StgIn}}{V_{Ref}} - \frac{G_E}{1+\delta_{FB}} \cdot ((1+\delta_1) \cdot B_1 + (1+\delta_2) \cdot B_2 + \right. \right.$$
$$\left. \left. (1+\delta_3) \cdot B_3) + B_1' + B_2' + B_3' \right) \cdot \frac{2^{n_{Be}-1}}{2} \right|$$

Inserting Eq. (3) into (1) gives (5). When further summing in the output of STGi as illustrated in FIG. 7, Eq. (6) results. Without any calibration, $B_2'$ and $B_3'$ equals $B_1$ to $B_3$, canceling out the subtractions done by the MDAC in the analog domain. However, due to finite op-amp gain and capacitor mismatches, this cancellation is not complete. Further in the description, this effect will be referred to as the "additive error". In the prior art, the additive error is accounted for by measuring the quantities given by (7), storing them and correcting for them in normal operation of the ADC. Then, (6) becomes (11), showing the remaining part of Eq. (6), Eq. (11) shows that the inaccuracy in the stage gain, deviating from the desired value of 4 (in case 2.8 b stage) by the finite loop gain of the op-amp through $G_E$ and mismatch in the feedback capacitor $\delta_{FB}$. Further in the description this effect will be referred to as the "multiplicative error", $$B_i' = \frac{G_E}{1+\delta_{FB}} \cdot (1+\delta_i), \, i \in [1, 2, 3] \tag{7}$$

$$D_{SumStgi} = \left| \left( \frac{G_E}{1+\delta_{FB}} \cdot 4 \cdot \frac{V_{StgIn}}{V_{Ref}} \right) \cdot \frac{2^{n_{Be}}-1}{2} \right| \tag{8}$$

When the additive error is corrected for STGi and the preceding stages, the remaining multiplicative error of each stage results in an overall ADC gain different from the ideal ADC gain. Generally, this does not lead to distortion. However, distortion occurs in certain cases.

For example, distortion occurs in cases with low $G_E$. In "A 92.5 mW 205 MS/s 10 b Pipeline IF ADC Implemented in 1.2V/3.3V 0.13 μm CMOS" by Hernes et al. published at IISSCC2007, the stage op-amps are made of single-stage op-amps. The open loop gain of these op-amps is so low such that $G_E$ will be far less than one. The gain factor of each stage is multiplied down the row of stages, resulting in a reduced full scale range of the ADC. In this paper, the finite op-amp gain is calibrated for by measuring $G_E$ of each stage.

Figure 11:
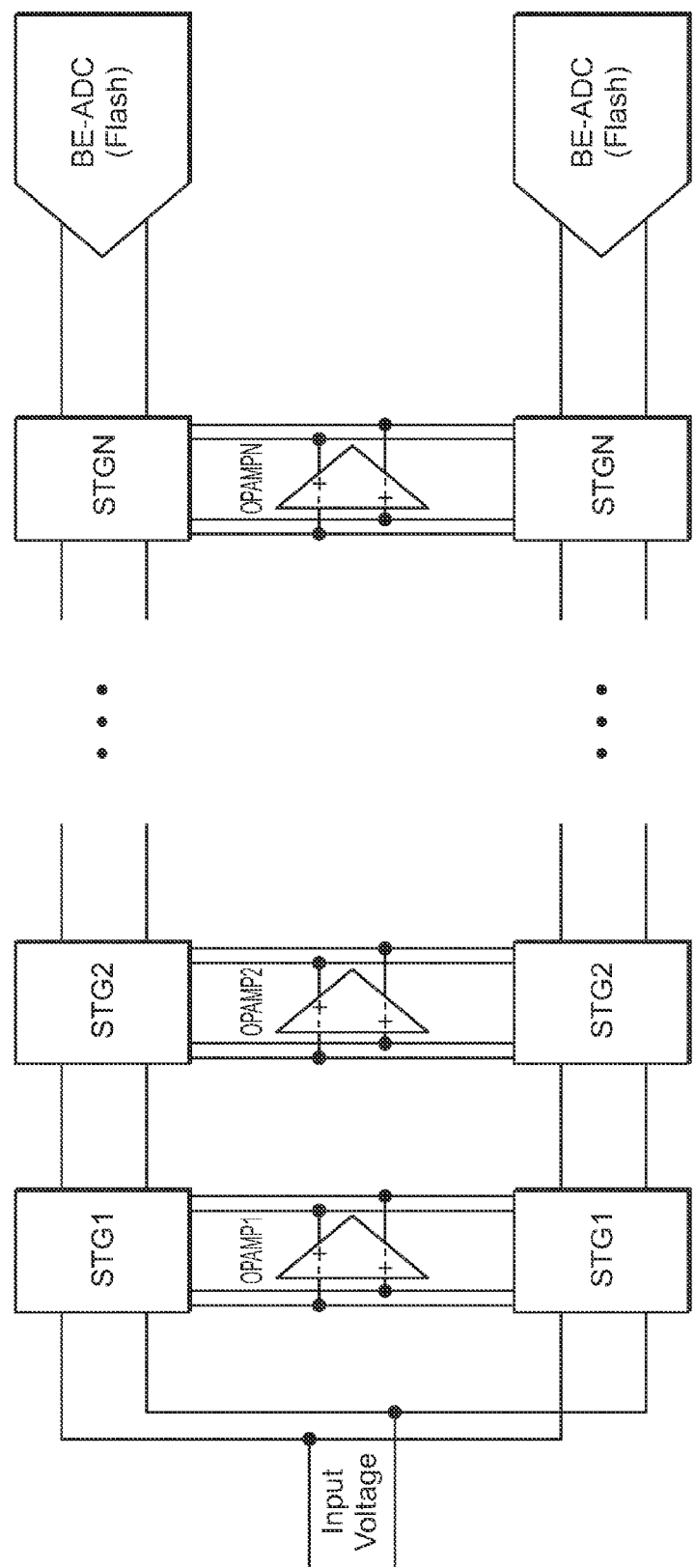
FIG. 11 is a block diagram illustrating two time interleaved pipeline ADCs in which an op-amp is shared at each stage in accordance with one or more embodiments.

Distortion can also occur in cases with double sampling stages. Double sampling of a stage (explained, e.g, in "A 10-bit 200-MS/s CMOS Parallel Pipeline A/D Converter" by L. Sumanen et al. in JSSC July 2001) occurs in two time-interleaved ADCs where each pipeline stage shares the op-amp with the same stage in the other ADC as shown in FIG. 11. Gain mismatches between the stages will result in a spur at the frequency FS/2-Fin, where FS and Fin are the ADC sampling and input frequency, respectively. Assuming that the op-amp gain is the same (since the op-amp is shared), the gain mismatch is caused mainly by capacitor mismatch in the feedback capacitor.

Distortion can also occur in cases with parallel connection of several ADCs, when taking one or more ADC off-line for calibration (see PCT Publication WO2011/051763). To avoid distortion effects when taking one or more ADCs offline for calibration, the gain of each ADC should be the same.

Therefore, the proposed calibration scheme measures and calibrates additive, offset, and multiplicative errors.

To calibrate for additive, offset, and multiplicative errors, the measurement for these effects is carried out as close to normal operation as possible. For measurement of errors, the reference voltages are utilized as excitation of the stage input and for example sampling on just one of the four capacitors. The stage gain is then 1, and the stage output is spanned out to its maximum voltage $V_{FS}=V_{Ref}$. Due to op-amp gain compression when spanned out to its full scale value, the op-amp open-loop gain will be at the lowest and the measured coefficients will be inaccurate for most of the samples in normal operation.

Figure 10:
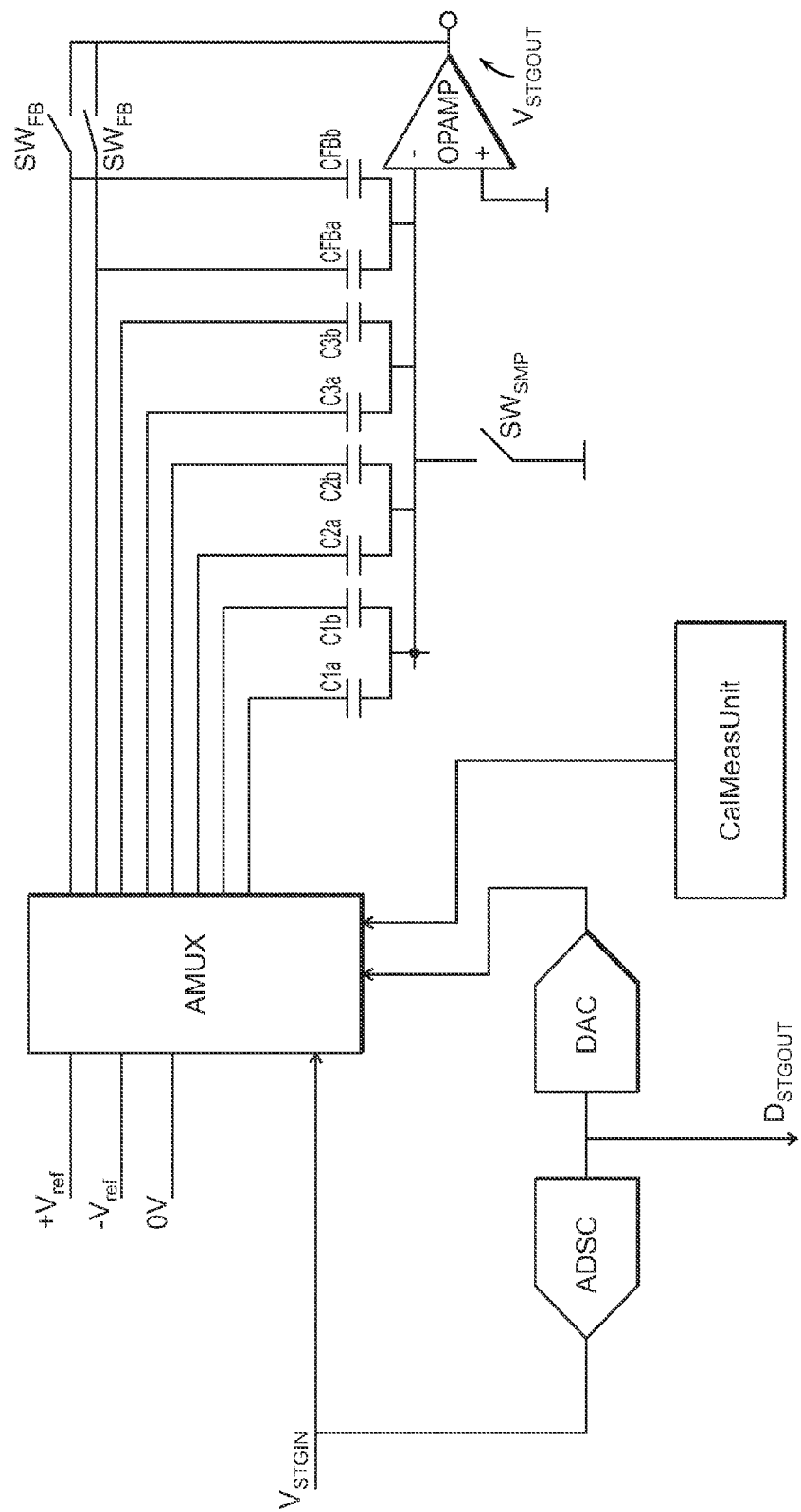
FIG. 10 is a block diagram illustrating a pipeline stage with split capacitors, in which a stage calibration measurement operation is performed in accordance with one or more embodiments.

If each of the capacitors $C_1$ to $C_3$ and $C_{FB}$ is divided in 2 as shown by FIG. 10, it is possible to sample the reference voltage over one half of the capacitors. The stage gain is then ½ from input to output and the stage output is spanned out to half the maximum value. To measure one capacitor, two measurement are performed (one of each half capacitor, for instance first on $C_{1a}$ and then on $C_{1b}$) and the measured values can be summed digitally. Implementing this in Eq. (1), and at the same time setting $B_1$ to $B_3$ to zero, Eq. (9) occurs. Here, for each sample the gain from input to output is ½ and the stage output is spanned out $V_{Ref}/2$, which is a very convenient voltage to measure the stage errors.

$$sumD_{BeOutCx} = \tag{9}$$
$$\left[ \frac{G_E \cdot \left(\frac{C_{xa}}{C_{FB}}\right) \cdot V_{Ref}}{V_{Ref}} \cdot \frac{2^{n_{Be}}-1}{2} \right] + \left[ \frac{G_E \cdot \left(\frac{C_{xb}}{C_{FB}}\right) \cdot V_{Ref}}{V_{Ref}} \cdot \frac{2^{n_{Be}}-1}{2} \right] =$$
$$\frac{2^{n_{Be}}-1}{2} \cdot G_E \cdot \frac{C_{xa}+C_{xb}}{C_{FB}} + \epsilon_{xa} + \epsilon_{xb} =$$
$$\frac{2^{n_{Be}}-1}{2} \cdot G_E \cdot \frac{C_x}{C_{FB}} + \epsilon_{xa} + \epsilon_{xb}$$

In Eq. (9), $C_{xa}$ and $C_{xb}$ are each half of $C_x$, where the index x is one of 1, 2, 3 or FB. Further, $\epsilon_{xa}$ and $\epsilon_{xb}$ are the quantization- and white noise from the first and second sample, respectively. When inserting the definitions in (3) into (9), the following equations can be derived:

$$sumD_{BeOutC1} = \frac{2^{n_{Be}}-1}{2} \cdot G_E \cdot \frac{1+\delta_1}{1+\delta_{FB}} + \epsilon_{1a} + \epsilon_{1b} \tag{10}$$

$$sumD_{BeOutC2} = \frac{2^{n_{Be}}-1}{2} \cdot G_E \cdot \frac{1+\delta_2}{1+\delta_{FB}} + \epsilon_{2a} + \epsilon_{2b} \tag{11}$$

$$sumD_{BeOutC3} = \frac{2^{n_{Be}}-1}{2} \cdot G_E \cdot \frac{1+\delta_3}{1+\delta_{FB}} + \epsilon_{3a} + \epsilon_{3b} \tag{12}$$

$$sumD_{BeOutCFB} = \frac{2^{n_{Be}}-1}{2} \cdot G_E + \epsilon_{FBa} + \epsilon_{FBb} \tag{13}$$

Now, the values of (10) to (13) can be measured as an average of a number of samples N to filter out quantization- and white noise, We then get the following measured values:

$$m_{C1} = \frac{2^{n_{Be}}-1}{2} \cdot G_E \cdot \frac{1+\delta_1}{1+\delta_{FB}} + \frac{1}{N} \cdot \sum_{i=1}^{N} \epsilon_{1i} \tag{14}$$

$$m_{C2} = \frac{2^{n_{Be}}-1}{2} \cdot G_E \cdot \frac{1+\delta_2}{1+\delta_{FB}} + \frac{1}{N} \cdot \sum_{i=1}^{N} \epsilon_{2i} \quad (15)$$

$$m_{C3} = \frac{2^{n_{Be}}-1}{2} \cdot G_E \cdot \frac{1+\delta_3}{1+\delta_{FB}} + \frac{1}{N} \cdot \sum_{i=1}^{N} \epsilon_{3i} \quad (16)$$

$$m_{Gain} = \frac{2^{n_{Be}}-1}{2} \cdot G_E + \frac{1}{N} \cdot \sum_{i=1}^{N} \epsilon_{Gaini} \quad (17)$$

where $\epsilon_{x1}$ (x is now 1, 2, 3 or Gain) is a stochastic variable consisting of the combined electrical- and quantization noise for the stage under measurement and the back-end ADC. N is the number of sampled values used in the measurement (here, each sample is the sum of 2 samples of half $C_x$). The expectation value and variance can be found by the following derivation:

$$\mu_{m_{C1}} = E[m_{C1}] = \frac{2^{n_{Be}}-1}{2} \cdot G_E \cdot \frac{1+\delta_1}{1+\delta_{FB}} \quad (18)$$

$$\sigma_{m_{C1}}^2 = E[(m_{C1}-\mu_{m_{C1}})^2] = E\left[\left(\frac{1}{N^2}\cdot\sum_{i=1}^{N}\epsilon_{1i}\right)^2\right] = \frac{1}{N^2}\cdot\sum_{i=1}^{N}E[\epsilon_{1i}^2] = \frac{1}{N}\cdot\sigma_{\epsilon_1}^2$$

$$\sigma_{m_{C1}} = \frac{1}{\sqrt{N}}\cdot\sigma_{\epsilon_1}$$

Eq. (18) shows that the first term in the (14) will be the expectation value, while the standard deviation is the combined noise divided by the square root of N, showing that the measurement becomes more accurate for increasing N. Similar derivations can be performed for Eq. (15) to (17).

Assuming $N\to\infty$ and further solve the equation set (4) and (14) to (17), we get the following estimates for the capacitor mismatches and stage closed loop gain:

$$\delta_1^{est} = \frac{3\cdot m_{C1} - m_{C2} - m_{C3} - m_{Gain}}{m_{C1}+m_{C2}+m_{C3}+m_{Gain}} \quad (19)$$

$$\delta_2^{est} = \frac{3\cdot m_{C2} - m_{C1} - m_{C3} - m_{Gain}}{m_{C1}+m_{C2}+m_{C3}+m_{Gain}} \quad (20)$$

$$\delta_3^{est} = \frac{3\cdot m_{C3} - m_{C1} - m_{C2} - m_{Gain}}{m_{C1}+m_{C2}+m_{C3}+m_{Gain}} \quad (21)$$

$$\delta_{FB}^{est} = \frac{3\cdot m_{Gain} - m_{C1} - m_{C2} - m_{C3}}{m_{C1}+m_{C2}+m_{C3}+m_{Gain}} \quad (22)$$

$$G_E^{est} = \frac{2}{2^{n_{Be}}-1} \cdot m_{Gain} \quad (23)$$

Inserting (14) to (17) into (19) to (23) we get:

$$\delta_1^{est} = \frac{\frac{2^{n_{Be}}-1}{2}\cdot\frac{G_E}{1+\delta_{FB}}\cdot(3\cdot(1+\delta_1)-(1+\delta_2)-(1+\delta_3)-(1+\delta_{FB}))+\frac{1}{N}\cdot\sum_{i=1}^{N}(3\cdot\epsilon_{1i}-\epsilon_{2i}-\epsilon_{3i}-\epsilon_{Gaini})}{\frac{2^{n_{Be}}-1}{2}\cdot\frac{G_E}{1+\delta_{FB}}\cdot((1+\delta_1)+(1+\delta_2)+(1+\delta_3)+(1+\delta_{FB}))+\frac{1}{N}\cdot\sum_{i=1}^{N}(\epsilon_{1i}+\epsilon_{2i}+\epsilon_{3i}+\epsilon_{Gaini})} = \quad (24)$$

$$\frac{4\cdot\frac{2^{n_{Be}}-1}{2}\cdot\frac{G_E}{1+\delta_{FB}}\cdot\delta_1 + \frac{1}{N}\cdot\sum_{i=1}^{N}(3\cdot\epsilon_{1i}-\epsilon_{2i}-\epsilon_{3i}-\epsilon_{Gaini})}{4\cdot\frac{2^{n_{Be}}-1}{2}\cdot\frac{G_E}{1+\delta_{FB}} + \frac{1}{N}\cdot\sum_{i=1}^{N}(\epsilon_{1i}+\epsilon_{2i}+\epsilon_{3i}+\epsilon_{Gaini})}$$

From the derivation in (24), we see that when $N\to\infty$ $\delta_1^{est}\to\delta_1$, the capacitor mismatch estimation is correct. This will be the same for the estimated values $\delta_2'$; $\delta_3'$ and $\delta_{FB}^{est}$. For $G_E^{est}$ we have:

$$G_E^{est} = \frac{2}{2^{n_{Be}}-1} \cdot \left(\frac{2^{n_{Be}}-1}{2}\cdot G_E + \frac{1}{N}\cdot\sum_{i=1}^{N}\epsilon_{Gaini}\right) = \quad (25)$$

$$G_E + \frac{2}{2^{n_{Be}}-1}\cdot\frac{1}{N}\cdot\sum_{i=1}^{N}\epsilon_{Gaini}$$

Eq. (25) shows that $N\to\infty$ $G_E^{est}\to G_E$ and the estimation is thus correct. Both (24) and (25) give requirement to N. N should be large enough such that the noise is not jeopardizing the estimated value. The requirement to N is set by the specification to distortion and by the level of noise produced by the ABC. To set the requirement to N, high-level simulations modeling electrical noise and quantization noise can be used.

Now the different parameters are estimated, and the output of the back-end ADC is adjusted such that the additive and multiplicative stage errors are corrected before being summed with the bits of the stage itself.

Re-writing eq. (5):

$$D_{BeOut} = \left\lfloor 4\cdot\frac{G_E}{1+\delta_{FB}}\cdot\left(\frac{V_{StgIn}}{V_{Ref}} - \frac{B_2+(1+\delta_3)\cdot B_3}{4}\right)\cdot\frac{2^{n_{Be}}-1}{2}\right\rfloor \quad (26)$$

$$= \left\lfloor 4\cdot\frac{G_E}{1+\delta_{FB}}\left(\frac{V_{StgIn}}{V_{Ref}} - \frac{B_1+B_2+B_3}{4} - \frac{\delta_1\cdot B_1+\delta_2\cdot B_2+\delta_3\cdot B_3}{4}\right)\cdot\frac{2^{n_{Be}}-1}{2}\right\rfloor$$

$$= \left\lfloor \frac{G_E}{1+\delta_{FB}}\cdot\left(4\cdot\frac{V_{StgIn}}{V_{Ref}} - (B_1+B_2+B_3)\right)\cdot\frac{2^{n_{Be}}-1}{2} - \frac{G_E}{1+\delta_{FB}}\cdot(\delta_1\cdot B_1+\delta_2\cdot B_2+\delta_3\cdot B_3)\cdot\frac{2^{n_{Be}}-1}{2}\right\rfloor$$

Lets further assume that the floor sign is additive quantization noise $\epsilon_Q$ and that we also add electrical noise $\epsilon_{EN}$:

$$D_{BeOut} = \frac{G_E}{1+\delta_{FB}}\cdot\left(4\cdot\frac{V_{StgIn}}{V_{Ref}} - (B_1+B_2+B_3)\right)\cdot\frac{2^{n_{Be}}-1}{2} + \quad (27)$$

$$\epsilon_Q + \epsilon_{EN} - \frac{G_E}{1+\delta_{FB}}\cdot(\delta_1\cdot B_1+\delta_2\cdot B_2+\delta_3\cdot B_3)\cdot\frac{2^{n_{Be}}-1}{2}$$

To adjust for the errors in (27), the equation is first corrected for the multiplicative error utilizing a gain coefficient $K_{Stg}$ given by (28). Note that the term "multiplicative error" has a slightly different meaning than defined before: here, the whole equation is corrected for the multiplicative error before correcting for additive errors. Multiplying (27) by $K_{Stg}$ gives (29).

$$K_{Stg} = \frac{1 + \delta_{FB}^{est}}{G_E^{est}} \quad (28)$$

$$D_{BeOutCalGain} = \quad (29)$$
$$K_{Stg} \cdot \frac{G_E}{1+\delta_{FB}} \cdot \left(4 \cdot \frac{V_{StgIn}}{V_{Ref}} - (B_1 + B_2 + B_3)\right) \cdot \frac{2^{nBe}-1}{2} + K_{Stg} \cdot$$
$$(\epsilon_Q + \epsilon_{EN}) - K_{Stg} \cdot \frac{G_E}{1+\delta_{FB}} \cdot (\delta_1 \cdot B_1 + \delta_2 \cdot B_2 + \delta_3 \cdot B_3) \cdot \frac{2^{nBe}-1}{2}$$

When the back-end output is adjusted for the multiplicative error, it is possible to adjust for the additive error (capacitor mismatch) by just adding the estimated mismatch parameters as shown in (30). If we assume that all the parameters are estimated perfectly, the calibrated output will be the residue of the calibrated stage added some electrical noise and quantization noise.

$$D_{BeOutCal} = K_{Stg} \cdot \frac{G_E}{1+\delta_{FB}} \cdot \left(4 \cdot \frac{V_{StgIn}}{V_{Ref}} - (B_1 + B_2 + B_3)\right) \cdot \frac{2^{nBe}-1}{2} + \quad (30)$$
$$K_{Stg} \cdot (\epsilon_Q + \epsilon_{EN}) - K_{Stg} \cdot \frac{G_E}{1+\delta_{FB}} \cdot (\delta_1 \cdot B_1 + \delta_2 \cdot B_2 + \delta_3 \cdot B_3) \cdot$$
$$\frac{2^{nBe}-1}{2} + (\delta_1^{est} \cdot B_1 + \delta_2^{est} \cdot B_2 + \delta_3^{est} \cdot B_3) \cdot \frac{2^{nBe}-1}{2}$$

A practical implementation of the offset voltage measurement, mismatch- and gain errors can be done by alternating the input excitation of the stage between $+V_{Ref}$ and $-V_{Ref}$. The output of the stage will now alternate between $+V_{Ref}/2$ and $-V_{Ref}/2$. The measurement of gain- and mismatch coefficients can be done by summing the absolute value of the digital output, while the offset can be found by summing all the values directly. Derivation of $m_{Cx}$, where x is 1, 2 or 3 (see Eq. (14) to (16)), is done in Eq. (31), and derivation of $m_{Gain}$ is shown in (32) (which is equal to Eq. (17)). Eq. (33) shows the derivation of the offset measurement in the case of measuring capacitor mismatch and similar derivation can be shown in the case of measurement of offset from the gain measurement. In this implementation of offset measurement and calibration, the offset calibration term does not have to be updated before measurement of all coefficients are done.

$$m_{Cx} = \frac{1}{N} \cdot \frac{2^{nBe}-1}{2} \cdot \sum_{i=1}^{N} \left| G_E \cdot \frac{1+\delta_x}{1+\delta_{FB}} + \frac{V_{Os}}{V_{Ref}} \right| + \frac{1}{N} \cdot \sum_{i=1}^{N} \epsilon_{xi} = \quad (31)$$
$$\frac{1}{N} \cdot \frac{2^{nBe}-1}{2} \cdot$$
$$\left( \sum_{i=1}^{\frac{N}{2}} \left(G_E \cdot \frac{1+\delta_x}{1+\delta_{FB}} + \frac{V_{Os}}{V_{Ref}}\right) - \sum_{i=1}^{\frac{N}{2}} \left(-G_E \cdot \frac{1+\delta_x}{1+\delta_{FB}} + \frac{V_{Os}}{V_{Ref}}\right) \right) +$$
$$\frac{1}{N} \cdot \sum_{i=1}^{N} \epsilon_{xi} = \frac{2^{nBe}-1}{2} \cdot G_E \cdot \frac{1+\delta_x}{1+\delta_{FB}} + \frac{1}{N} \cdot \sum_{i=1}^{N} \epsilon_{xi}$$

$$m_{Gain} = \frac{1}{N} \cdot \frac{2^{nBe}-1}{2} \cdot \sum_{i=1}^{N} \left| G_E + \frac{V_{Os}}{V_{Ref}} \right| + \frac{1}{N} \cdot \sum_{i=1}^{N} \epsilon_{Gaini} = \quad (32)$$
$$\frac{1}{N} \cdot \frac{2^{nBe}-1}{2} \cdot \left( \sum_{i=1}^{\frac{N}{2}} \left(G_E + \frac{V_{Os}}{V_{Ref}}\right) - \sum_{i=1}^{\frac{N}{2}} \left(-G_E + \frac{V_{Os}}{V_{Ref}}\right) \right) +$$
$$\frac{1}{N} \cdot \sum_{i=1}^{N} \epsilon_{Gaini} = \frac{2^{nBe}-1}{2} \cdot G_E + \frac{1}{N} \cdot \sum_{i=1}^{N} \epsilon_{Gaini}$$

$$m_{Os} = \frac{1}{N} \cdot \frac{2^{nBe}-1}{2} \cdot \quad (33)$$
$$\left( \sum_{i=1}^{\frac{N}{2}} \left(G_E \cdot \frac{1+\delta_x}{1+\delta_{FB}} + \frac{V_{Os}}{V_{Ref}}\right) + \sum_{i=1}^{\frac{N}{2}} \left(-G_E \cdot \frac{1+\delta_x}{1+\delta_{FB}} + \frac{V_{Os}}{V_{Ref}}\right) \right) +$$
$$\frac{1}{N} \cdot \sum_{i=1}^{N} \epsilon_{xi} = \frac{2^{nBe}-1}{2} \cdot \frac{V_{Os}}{V_{Ref}} + \frac{1}{N} \cdot \sum_{i=1}^{N} \epsilon_{xi}$$

The errors of $STG_i$ can now be measured, stored and corrected for. $STG_i$ will now be included in the back-end ADC while measuring the preceding stage $STG_{i-1}$. The procedure will be carried on until all stages are calibrated. The ADC is then ready to be put online.

Figure 12:
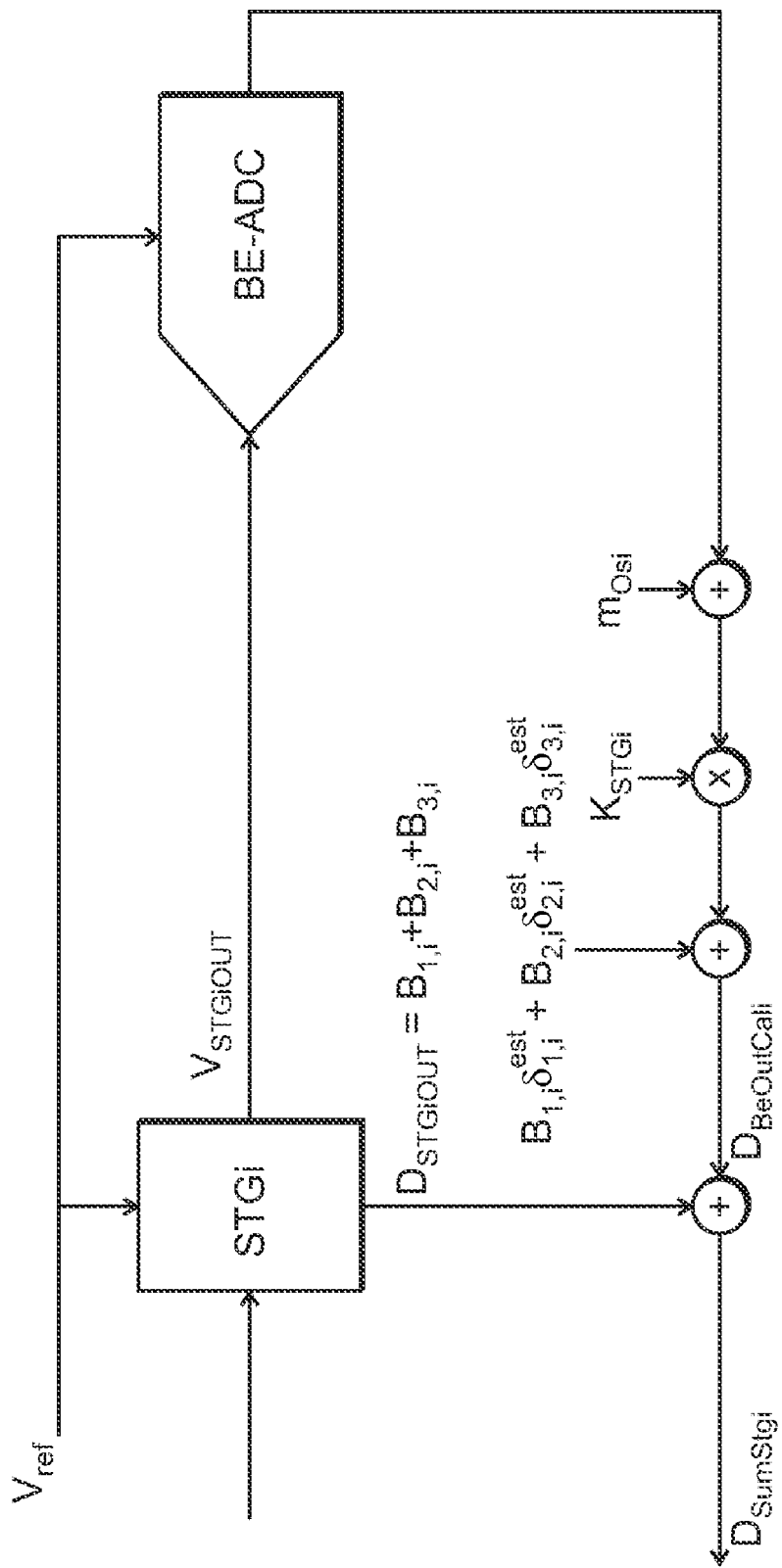
FIG. 12 is a block diagram illustrating calibration of a stage $STG_i$.

FIG. 12 shows the calibration of $STG_i$. When the coefficients are measured, all the coefficients are set to their nominal values:

$$K_{STGi}=1.$$

$$m_{Osi}=0$$

$$\delta_{1,i}^{est} = \delta_{2,i}^{est} = \delta_{3,i}^{est} = \delta_{FB,i}^{est} = 0 \quad (34)$$

Further, the stage sampler are disconnected from the stage signal inputs and the measurements of $m_{C1}$, $m_{C2}$, $m_{C3}$, $m_{Gain}$ and $m_{Os}$, are performed over N samples each. Further, the coefficients $K_{STGi}$, $\delta_{1,i}^{est}$, $\delta_{2,i}^{est}$, $\delta_{3,i}^{est}$, $\delta_{FB,i}^{est}$ and $m_{Ost}$ are then calculated and stored in the registers for SIG. Under normal operation mode, $D_{BeOutCal,i}$ will be the digital signal coming from the BE-ADC and adjusted for $SIG_i$ additive, multiplicative, and offset errors.

Figure 13:
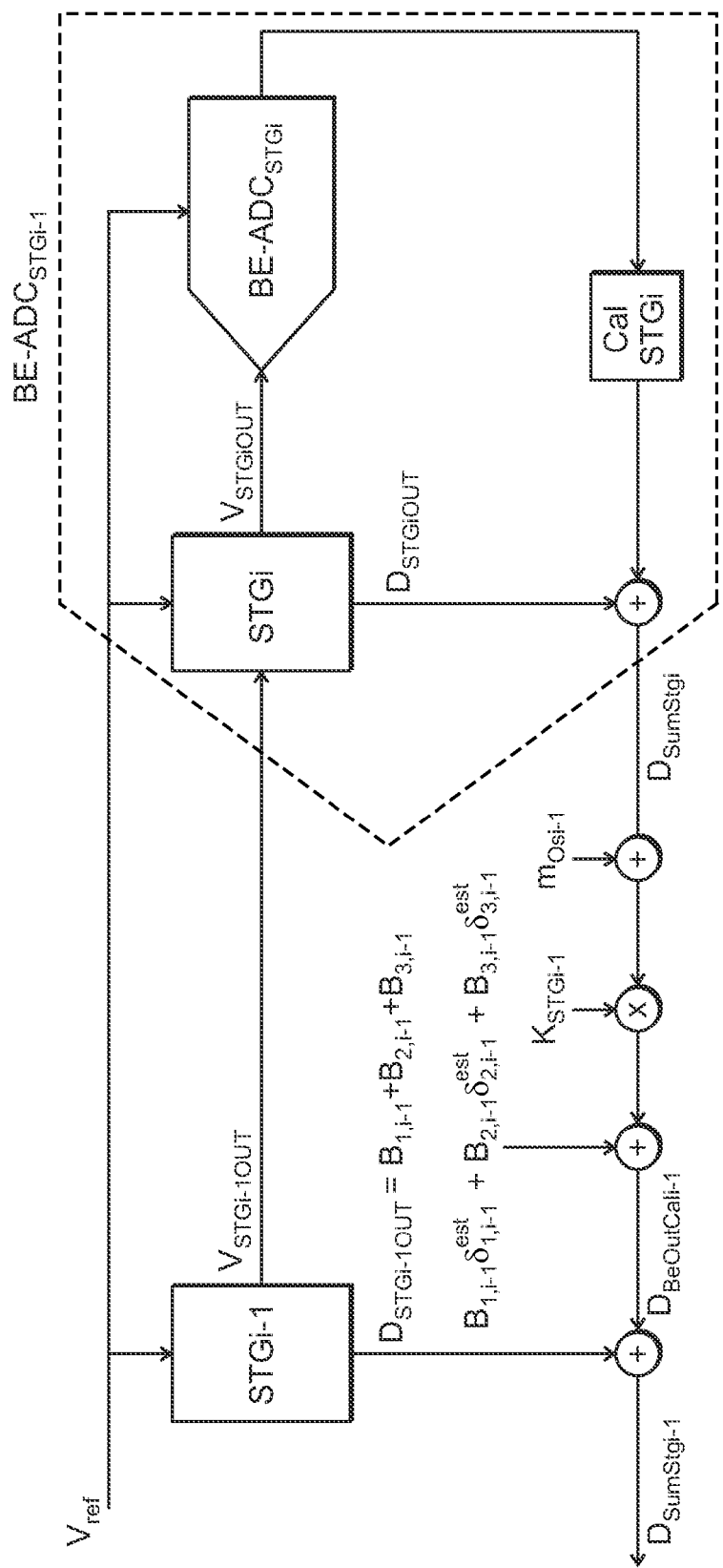
FIG. 13 is a block diagram illustrating calibration of a stage $STG_{i-1}$.

When $STG_i$ is calibrated, $STG_i$ is included in the BE-ADC measuring $STG_{i-1}$ as FIG. 13 illustrates. The same procedure is now carried out at this stage.

This procedure is carried upwards the pipeline chain until $STG_1$ is calibrated. Then, calibration ADC has been completed, and it can be made available to sample the ADC input signal.

Figure 14:
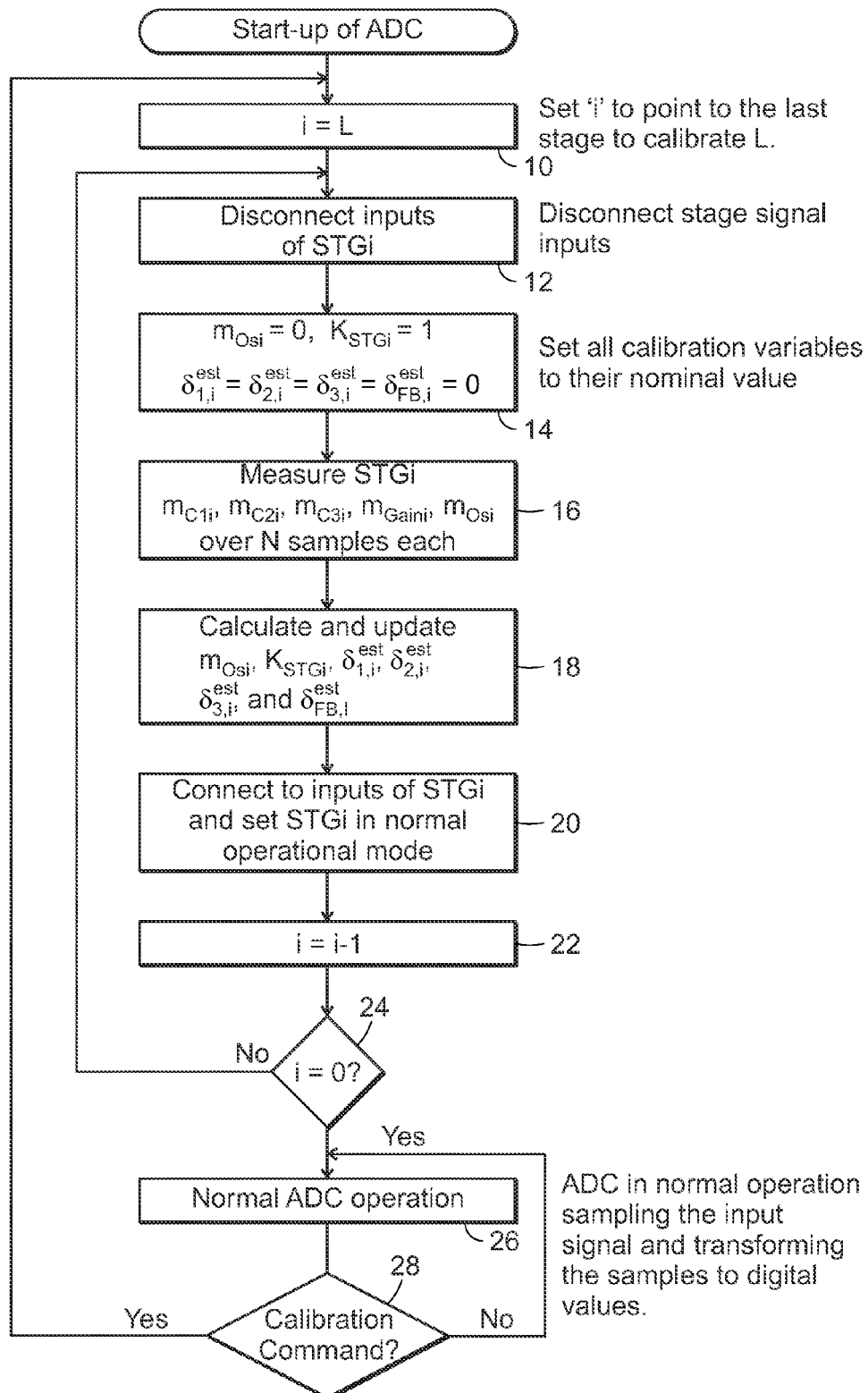
FIG. 14 is a flowchart illustrating a calibration procedure in accordance with one or more embodiments.

FIG. 14 is a flowchart summarizing the calibration procedure in accordance with one or more embodiments. At step 10, variable "i" is set to point to a selected last stage to calibrate. At step 12, inputs of the selected last stage are disconnected from an immediately preceding stage. At step 14, all calibration variables are set to their nominal values. At step 16, values for stage gain error, stage capacitive mismatch error, and stage offset error for the pipeline stage are measured. At step 18, calibration coefficients for the pipeline stage are calculated based on the measured values. The calibration coefficients are updated in registers (or other memory elements) for use in the normal operation mode. At step 20, the inputs of the pipeline stage are connected to the immediately preceding pipeline stage. In step 22, variable "i" is decreased by one. At step 24, if "i" is 0, calibration has been completed and the pipeline ADC is placed in a normal operation mode at step 26. If "i" is not 0, the calibration process continues at step 12. At step 28, if a calibration command is received, the pipeline ADC repeats the calibration process starting at step 10. If not, normal operation mode is continued.

Having thus described several illustrative embodiments, it is to be appreciated that various alterations, modifications, and improvements will readily occur to those skilled in the art. Such alterations, modifications, and improvements are intended to form a part of this disclosure, and are intended to be within the spirit and scope of this disclosure. While some examples presented herein involve specific combinations of functions or structural elements, it should be understood that those functions and elements may be combined in other ways according to the present disclosure to accomplish the same or different objectives. In particular, acts, elements, and features discussed in connection with one embodiment are not intended to be excluded from similar or other roles in other embodiments.

Additionally, elements and components described herein may be further divided into additional components or joined together to form fewer components for performing the same functions.

Accordingly, the foregoing description and attached drawings are by way of example only, and are not intended to be limiting.

What is claimed is:

1. A method of calibrating a pipeline analog-to-digital converter comprising one or more serially connected analog-to-digital pipeline stages and a back-end analog-to-digital converter, said pipeline analog-to-digital converter further including digital circuitry for receiving digital outputs of each of the one or more pipeline stages and the back-end converter, adjusting the outputs using calibration coefficients to correct additive, multiplicative, and offset errors, and combining the outputs, the method comprising the steps of:
   (a) for a selected pipeline stage:
      (i) disconnecting inputs of the pipeline stage from an immediately preceding pipeline stage, or if the pipeline stage is the first pipeline stage of the pipeline analog-to-digital converter disconnecting inputs of the pipeline stage from an input of the pipeline analog-to-digital converter;
      (ii) measuring values for stage gain errors, stage capacitive mismatch errors, and stage offset errors for the pipeline stage;
      (iii) calculating calibration coefficients for the pipeline stage based on the measured values and updating the calibration coefficients for use in correcting additive, multiplicative, and offset errors in a normal operation mode of the pipeline stage; and
      (iv) connecting the inputs of the pipeline stage to the immediately preceding pipeline stage, or if the pipeline stage is the first pipeline stage connecting inputs of the pipeline stage to an input of the pipeline analog-to-digital converter such that the pipeline stage can operate in a normal operation mode; and
   (b) if the selected pipeline stage is not the first pipeline stage, repeating steps (i)-(iv) separately for each pipeline stage immediately preceding the pipeline stage last calibrated until all pipeline stages preceding said selected pipeline stage have been successively calibrated so that the pipeline-analog-to-digital converter can be used in a normal operation mode.

2. The method of claim 1, wherein each pipeline stage includes an array of capacitor units, each capacitor unit comprising at least two capacitors connected in parallel, and wherein step (a)(ii) comprises measuring errors separately for each capacitor in a capacitor unit and summing the measured error values digitally.

3. The method of claim 2, wherein each capacitor unit comprises two capacitors.

4. The method of claim 1, wherein step (a)(ii) comprises collecting multiple samples for the stage gain errors, stage capacitive mismatch errors, and stage offset errors, and obtaining a mean value for each type of error.

5. The method of claim 1, wherein step (a)(ii) comprises measuring values for stage gain errors, stage capacitive mismatch errors, and stage offset errors at the same time.

6. The method of claim 1, further comprising setting the calibration coefficients for the pipeline stage to nominal values prior to measuring values for stage gain errors, stage capacitive mismatch errors, and stage offset errors for the pipeline stage.

7. The method of claim 1, wherein each pipeline stage samples an analog input signal into one single-ended or differential sampling network.

8. The method of claim 1, wherein each pipeline stage samples an analog input signal into two single-ended or differential sampling networks.

9. The method of claim 1, wherein the pipeline analog-to-digital converter is one of a plurality of parallel pipeline analog-to-digital converters, and wherein the method further comprises taking the pipeline analog-to-digital converter offline for calibration.

10. The method of claim 1, wherein the pipeline analog-to-digital converter comprises two parallel time interleaved analog-to-digital converters having pairs of corresponding pipeline stages sharing an op-amp.

11. The method of claim 10, wherein the pipeline analog-to-digital converter is one of two or more analog-to-digital converters forming a time interleaved analog-to-digital converter sampling the same input signal interleaved in time.

12. The method of claim 1, wherein the pipeline analog-to-digital converter is one of two or more analog-to-digital converters forming a time interleaved analog-to-digital converter sampling the same input signal interleaved in time.

13. The method of claim 1, wherein step (a)(ii) comprises measuring values for stage gain errors, stage capacitive mismatch errors, and stage offset errors for the pipeline stage a plurality of times between uses of the pipeline stage in normal operational mode before calculating calibration coefficients for the pipeline stage.

14. The method of claim 1, wherein in the normal operation mode of the pipeline analog-to-digital converter, the output of the back-end converter and each pipeline stage is adjusted by the coefficients to correct for additive, multiplicative, and offset errors.

15. A pipeline analog-to-digital converter, comprising:
   one or more serially connected analog-to-digital pipeline stages;
   a back-end analog-to-digital converter serially connected to the last one of the one or more pipeline stages;
   digital circuitry for receiving digital outputs of each of the one or more pipeline stages and the back-end converter, adjusting the outputs using calibration coefficients to correct additive, multiplicative, and offset errors, and combining the outputs;
   a plurality of memory elements for storing the calibration coefficients for each of the pipeline stages; and
   a calibration measurement unit for calibrating the pipeline analog-to-digital converter by measuring values for stage gain errors, stage capacitive mismatch errors, and stage offset errors for a selected pipeline stage disconnected from an immediately preceding pipeline stage or from an input of the pipeline analog-to-digital converter, calculating the calibration coefficients for the pipeline stage based on the measured values and updating the calibration coefficients in the memory elements for use in correcting additive, multiplicative, and offset errors in a normal operation mode of the pipeline stage, and if the selected pipeline stage is not the first pipeline stage, repeating the calibration steps separately for each pipeline stage immediately preceding the pipeline stage last calibrated until all pipeline stages preceding the selected pipeline stage have been successively calibrated so that the pipeline analog-to-digital converter can be used in a normal operation mode.

16. The pipeline analog-to-digital converter of claim 15, wherein each of the one or more pipeline stages includes an array of capacitor units, each capacitor unit comprising at least two capacitors connected in parallel, and wherein the calibration measurement unit measures errors separately for each capacitor in a capacitor unit and sums the measured error values digitally.

17. The pipeline analog-to-digital converter of claim 16, wherein each capacitor unit comprises two capacitors.

18. The pipeline analog-to-digital converter of claim 15, wherein the calibration measurement unit collects multiple samples for the stage gain errors, stage capacitive mismatch errors, and stage offset errors, and obtains a mean value for each type of error.

19. The pipeline analog-to-digital converter of claim 15, wherein the calibration measurement unit measures values for stage gain errors, stage capacitive mismatch errors, and stage offset errors at the same time.

20. The pipeline analog-to-digital converter of claim 15, wherein each analog-to digital pipeline stage samples an analog input signal into one single-ended or differential sampling network.

21. The pipeline analog-to-digital converter of claim 15, wherein each analog-to digital pipeline stage samples an analog input signal into two single-ended or differential sampling networks.

22. The pipeline analog-to-digital converter of claim 15, wherein the pipeline analog-to-digital converter is one of a plurality of parallel pipeline analog-to-digital converters, and wherein the analog-to-digital converter is taken offline for calibration.

23. The pipeline analog-to-digital converter of claim 15, wherein the digital circuitry comprises one or more digital delay and summing elements.

24. The pipeline analog-to-digital converter of claim 15, wherein the pipeline analog-to-digital converter comprises two parallel time interleaved analog-to-digital converters having pairs of corresponding pipeline stages sharing an op-amp.

25. The pipeline analog-to-digital converter of claim 24, wherein the pipeline analog-to-digital converter is one of two or more analog-to-digital converters forming a time interleaved analog-to-digital converter sampling the same input signal interleaved in time.

26. The pipeline analog-to-digital converter of claim 15, wherein the pipeline analog-to-digital converter is one of two or more analog-to-digital converters forming a time interleaved analog-to-digital converter sampling the same input signal interleaved in time.

27. The pipeline analog-to-digital converter of claim 15, wherein values for stage gain errors, stage capacitive mismatch errors, and stage offset errors for the pipeline stage are measured a plurality of times between uses of the pipeline stage in normal operational mode before calculating calibration coefficients for the pipeline stage.

28. The pipeline analog-to-digital converter of claim 15, wherein in the normal operation mode of the pipeline analog-to-digital converter, the output of the back-end converter and each pipeline stage is adjusted by the coefficients to correct for additive, multiplicative, and offset errors.

29. A method of calibrating a pipeline analog-to-digital converter comprising one or more serially connected analog-to-digital pipeline stages and a back-end analog-to-digital converter, said pipeline analog-to-digital converter further including digital circuitry for receiving digital outputs of each of the one or more pipeline stages and the back-end converter, adjusting the outputs using calibration coefficients to correct additive, multiplicative, and offset errors, and combining the outputs, the method comprising the steps of:
(a) disconnecting an input of a selected pipeline stage of the one or more serially connected analog-to-digital pipeline stages from an immediately preceding pipeline stage or from an input of the pipeline analog-to-digital converter;
(b) measuring values for stage gain errors, stage capacitive mismatch errors, and stage offset errors for the selected pipeline stage;
(c) calculating calibration coefficients for the selected pipeline stage based on the measured values and updating the calibration coefficients for use in correcting additive, multiplicative, and offset errors in a normal operation mode of the pipeline stage; and
(d) connecting the input of the selected pipeline stage to the immediately preceding pipeline stage or to the input of the pipeline analog-to-digital converter so that the pipeline stage can operate in a normal operation mode.

30. The method of claim 29, wherein the selected pipeline stage is the first pipeline stage of the one or more serially connected analog-to-digital pipeline stages, and steps (a) and (c) comprise disconnecting and connecting the first pipeline stage to the input of the pipeline analog-to-digital converter, respectively.

31. The method of claim 29, wherein each pipeline stage includes an array of capacitor units, each capacitor unit comprising at least two capacitors connected in parallel, and wherein step (b) comprises measuring errors separately for each capacitor in a capacitor unit and summing the measured error values digitally.

32. The method of claim 31, wherein each capacitor unit comprises two capacitors.

33. The method of claim 29, wherein step (h) comprises collecting multiple samples for the stage gain errors, stage capacitive mismatch errors, and stage offset errors, and obtaining a mean value for each type of error.

34. The method of claim 29, wherein step (b) comprises measuring values for stage gain errors, stage capacitive mismatch errors, and stage offset errors at the same time.

35. The method of claim 29, further comprising setting the calibration coefficients for the first pipeline stage to nominal values prior to measuring values for stage gain errors, stage capacitive mismatch errors, and stage offset errors for the first pipeline stage.

36. The method of claim 29, wherein each pipeline stage samples an analog input signal into one single-ended or differential sampling network.

37. The method of claim 29, wherein each pipeline stage samples an analog input signal into two single-ended or differential sampling networks.

38. The method of claim 29, wherein the pipeline analog-to-digital converter is one of a plurality of parallel pipeline analog-to-digital converters, and wherein the method further comprises taking the pipeline analog-to-digital converter offline for calibration.

39. The method of claim 29, wherein the pipeline analog-to-digital converter comprises two parallel time interleaved analog-to-digital converters having pairs of corresponding pipeline stages sharing an op-amp.

40. The method of claim 39, wherein the pipeline analog-to-digital converter is one of two or more analog-to-digital converters forming a time interleaved analog-to-digital converter sampling the same input signal interleaved in time.

41. The method of claim 29, wherein the pipeline analog-to-digital converter is one of two or more analog-to-digital converters forming a time interleaved analog-to-digital converter sampling the same input signal interleaved in time.

42. The method of claim 29, wherein step (a)(ii) comprises measuring values for stage gain errors, stage capacitive mismatch errors, and stage offset errors for the pipeline stage a plurality of times between uses of the pipeline stage in normal operational mode before calculating calibration coefficients for the pipeline stage.

43. The method of claim 29, wherein in the normal operation mode of the pipeline analog-to-digital converter, the output of the back-end converter and each pipeline stage is adjusted by the coefficients to correct for additive, multiplicative, and offset errors.

44. A pipeline analog-to-digital converter, comprising:
one or more serially connected analog-to-digital pipeline stages;
a back-end analog-to-digital converter serially connected to the last one of the one or more pipeline stages;
digital circuitry for receiving digital outputs of each of the one or more pipeline stages and the back-end converter, adjusting the outputs using calibration coefficients to correct additive, multiplicative, and offset errors, and combining the outputs;
a plurality of memory elements for storing the calibration coefficients for each of the pipeline stages; and
a calibration measurement unit for calibrating the pipeline analog-to-digital converter by measuring values for stage gain errors, stage capacitive mismatch errors, and stage offset errors for a selected pipeline stage disconnected from an immediately preceding pipeline stage or from an input of the pipeline analog-to-digital converter, and calculating the calibration coefficients for the pipeline stage based on the measured values and updating the calibration coefficients in the memory elements for use in correcting additive, multiplicative, and offset errors in a normal operation mode of the pipeline stage.

45. The pipeline analog-to-digital converter of claim 44, wherein the selected pipeline stage is the first pipeline stage of the one or more serially connected analog-to-digital pipeline stages, and wherein the first pipeline stage is disconnected from the input of the pipeline analog-to-digital converter during calibration.

46. The pipeline analog-to-digital converter of claim 44, wherein each of the one or more pipeline stages includes an array of capacitor units, each capacitor unit comprising at least two capacitors connected in parallel, and wherein the calibration measurement unit measures errors separately for each capacitor in a capacitor unit and sums the measured error values digitally.

47. The pipeline analog-to-digital converter of claim 46, wherein each capacitor unit comprises two capacitors.

48. The pipeline analog-to-digital converter of claim 44, wherein the calibration measurement unit collects multiple samples for the stage gain errors, stage capacitive mismatch errors, and stage offset errors, and obtains a mean value for each type of error.

49. The pipeline analog-to-digital converter of claim 44, wherein the calibration measurement unit measures values for stage gain errors, stage capacitive mismatch errors, and stage offset errors at the same time.

50. The pipeline analog-to-digital converter of claim 44, wherein each analog-to digital pipeline stage samples an analog input signal into one single-ended or differential sampling network.

51. The pipeline analog-to-digital converter of claim 44, wherein each analog-to digital pipeline stage samples an analog input signal into two single-ended or differential sampling networks.

52. The pipeline analog-to-digital converter of claim 44, wherein the pipeline analog-to-digital converter is one of a plurality of parallel pipeline analog-to-digital converters, and wherein the analog-to-digital converter is taken offline for calibration.

53. The pipeline analog-to-digital converter of claim 44, wherein the digital circuitry comprises one or more digital delay and summing elements.

54. The pipeline analog-to-digital converter of claim 44, wherein the pipeline analog-to-digital converter comprises two parallel time interleaved analog-to-digital converters having pairs of corresponding pipeline stages sharing an op-amp.

55. The pipeline analog-to-digital converter of claim 54, wherein the pipeline analog-to-digital converter is one of two or more analog-to-digital converters forming a time interleaved analog-to-digital converter sampling the same input signal interleaved in time.

56. The pipeline analog-to-digital converter of claim 44, wherein the pipeline analog-to-digital converter is one of two or more analog-to-digital converters forming a time interleaved analog-to-digital converter sampling the same input signal interleaved in time.

57. The pipeline analog-to-digital converter of claim 44, wherein values for stage gain errors, stage capacitive mismatch errors, and stage offset errors for the pipeline stage are measured a plurality of times between uses of the pipeline stage in normal operational mode before calculating calibration coefficients for the pipeline stage.

58. The pipeline analog-to-digital converter of claim 44, wherein in the normal operation mode of the pipeline analog-to-digital converter, the output of the back-end converter and each pipeline stage is adjusted by the coefficients to correct for additive, multiplicative, and offset errors.

\* \* \* \* \*